(12) United States Patent
Green et al.

(10) Patent No.: US 12,486,120 B2
(45) Date of Patent: Dec. 2, 2025

(54) SUBSTRATE PROCESSING SYSTEM CARRIER

(71) Applicant: Applied Materials, Inc., Santa Clara, CA (US)

(72) Inventors: Aaron Green, Sunnyvale (CA); Nicholas Michael Bergantz, Sunnyvale, CA (US); Damon K. Cox, Jarrell, TX (US); Andreas Schmid, Meyriez (CH)

(73) Assignee: Applied Materials, Inc., Santa Clara, CA (US)

( * ) Notice: Subject to any disclaimer, the term of this patent is extended or adjusted under 35 U.S.C. 154(b) by 864 days.

(21) Appl. No.: 17/205,878

(22) Filed: Mar. 18, 2021

(65) Prior Publication Data

US 2021/0292104 A1 Sep. 23, 2021

Related U.S. Application Data

(60) Provisional application No. 62/993,528, filed on Mar. 23, 2020.

(51) Int. Cl.
*B65G 47/90* (2006.01)
*B25J 15/08* (2006.01)

(52) U.S. Cl.
CPC .............. *B65G 47/90* (2013.01); *B25J 15/08* (2013.01)

(58) Field of Classification Search
CPC ......... H01L 21/67309; H01L 21/67333; H01L 21/67346; H01L 21/67369;
(Continued)

(56) References Cited

U.S. PATENT DOCUMENTS 5,445,486 A 8/1995 Kitayama et al.
5,749,469 A 5/1998 Williams
(Continued)

FOREIGN PATENT DOCUMENTS

CN 107481967 A 12/2017
CN 110722580 A * 1/2020
(Continued)

OTHER PUBLICATIONS

CN 110722580—Machine Translation (Year: 2020).*
(Continued)

*Primary Examiner* — Monica S Carter
*Assistant Examiner* — Alberto Saenz
(74) *Attorney, Agent, or Firm* — Lowenstein Sandler LLP

(57) ABSTRACT

A carrier includes a rigid body forming a plurality of openings and a plurality of fasteners configured to removably attach to the rigid body via the plurality of openings. A first set of fingers is configured to be removably attached to the rigid body via the plurality of fasteners and the plurality of openings. The first set of fingers is configured to support first content during first transportation of the carrier within a substrate processing system. A second set of fingers is configured to be removably attached to the rigid body via the plurality of fasteners and the plurality of openings. The second set of fingers is configured to support second content during second transportation of the carrier within the substrate processing system.

20 Claims, 11 Drawing Sheets

(58) Field of Classification Search
CPC ......... H01L 21/67383; H01L 21/67687; H01L 21/687; H01L 21/68728; H01L 21/68721; B65G 47/90; B25J 15/08
USPC ...................................................... 269/289 R
See application file for complete search history.

(56) References Cited

U.S. PATENT DOCUMENTS

| | | | |
|---|---|---|---|
| D407,073 S | 3/1999 | Burkhart et al. | |
| 6,109,677 A | 8/2000 | Anthony | |
| 6,199,291 B1 | 3/2001 | Ozee | |
| 6,676,759 B1 | 1/2004 | Takagi | |
| D489,739 S | 5/2004 | Okugawa | |
| 7,048,316 B1* | 5/2006 | Blank | H01L 21/68707 294/902 |
| D616,389 S | 5/2010 | Takahashi | |
| 7,792,350 B2 | 9/2010 | Kiley et al. | |
| 8,384,033 B2 | 2/2013 | Burns et al. | |
| 8,397,739 B2 | 3/2013 | Gregor et al. | |
| D684,546 S | 6/2013 | Kuzuoka | |
| 8,646,765 B2* | 2/2014 | Caldarone | B23K 31/02 269/119 |
| 8,784,033 B2 | 7/2014 | Kremerman et al. | |
| 9,175,393 B1* | 11/2015 | Higashi | C23C 16/4583 |
| 9,457,464 B2 | 10/2016 | Kremerman et al. | |
| 9,462,732 B2 | 10/2016 | Robinson et al. | |
| 9,579,788 B2 | 2/2017 | Rosenberg et al. | |
| 9,881,820 B2 | 1/2018 | Wong et al. | |
| 9,947,517 B1 | 4/2018 | Luere et al. | |
| 10,014,198 B2 | 7/2018 | Richardson | |
| 10,041,868 B2 | 8/2018 | Gottscho | |
| 10,062,589 B2 | 8/2018 | Wong et al. | |
| 10,062,590 B2 | 8/2018 | Wong et al. | |
| 10,062,599 B2 | 8/2018 | Genetti et al. | |
| 10,103,010 B2 | 10/2018 | Luere et al. | |
| 10,124,492 B2 | 11/2018 | Genetti et al. | |
| D908,645 S | 1/2021 | Savandaiah et al. | |
| D947,802 S | 4/2022 | Sakata et al. | |
| D954,769 S | 6/2022 | Green et al. | |
| 2003/0010657 A1 | 1/2003 | Zabka et al. | |
| 2004/0113444 A1 | 6/2004 | Blonigan et al. | |
| 2005/0186122 A1* | 8/2005 | Mercer | B01L 9/52 422/400 |
| 2007/0134904 A1 | 6/2007 | Wan et al. | |
| 2008/0258368 A1* | 10/2008 | Kinnison | B25B 5/142 269/41 |
| 2008/0267747 A1 | 10/2008 | DiBella et al. | |
| 2010/0194015 A1 | 8/2010 | Vekstein et al. | |
| 2015/0041353 A1 | 2/2015 | Adams et al. | |
| 2016/0211165 A1 | 7/2016 | McChesney et al. | |
| 2016/0211166 A1 | 7/2016 | Yan et al. | |
| 2016/0216185 A1 | 7/2016 | Gottscho | |
| 2016/0254172 A1* | 9/2016 | Adams | H01L 21/67389 206/711 |
| 2017/0053819 A1 | 2/2017 | Richardson | |
| 2017/0113355 A1 | 4/2017 | Genetti et al. | |
| 2017/0115657 A1 | 4/2017 | Trussell et al. | |
| 2017/0117172 A1 | 4/2017 | Genetti et al. | |
| 2017/0119339 A1 | 5/2017 | Johnson et al. | |
| 2017/0133283 A1 | 5/2017 | Kenworthy | |
| 2017/0213758 A1 | 7/2017 | Rice et al. | |
| 2017/0236688 A1 | 8/2017 | Caron et al. | |
| 2017/0236741 A1 | 8/2017 | Angelov et al. | |
| 2017/0236743 A1 | 8/2017 | Severson et al. | |
| 2017/0263478 A1 | 9/2017 | McChesney et al. | |
| 2017/0287682 A1 | 10/2017 | Musselman et al. | |
| 2017/0287753 A1 | 10/2017 | Musselman et al. | |
| 2017/0330786 A1 | 11/2017 | Genetti et al. | |
| 2017/0334074 A1 | 11/2017 | Genetti et al. | |
| 2018/0019107 A1 | 1/2018 | Ishizawa | |
| 2018/0019142 A1 | 1/2018 | Wong et al. | |
| 2018/0032062 A1 | 2/2018 | Trussell et al. | |
| 2018/0040492 A1 | 2/2018 | Wong et al. | |
| 2018/0068879 A1 | 3/2018 | Wong et al. | |
| 2018/0090354 A1 | 3/2018 | Sugita et al. | |
| 2018/0166259 A1 | 6/2018 | Ueda | |
| 2018/0218933 A1 | 8/2018 | Luere et al. | |
| 2018/0233328 A1 | 8/2018 | Ueda et al. | |
| 2018/0277416 A1 | 9/2018 | Takahashi et al. | |
| 2018/0301322 A1 | 10/2018 | Sugita et al. | |
| 2018/0315583 A1 | 11/2018 | Luere et al. | |
| 2018/0315640 A1 | 11/2018 | Ueda et al. | |
| 2019/0088531 A1 | 3/2019 | Sarode Vishwanath et al. | |
| 2019/0252234 A1 | 8/2019 | Genetti et al. | |
| 2020/0075430 A1 | 3/2020 | Sevillano et al. | |
| 2020/0122320 A1 | 4/2020 | Yoshida et al. | |
| 2020/0211877 A1 | 7/2020 | Raschke et al. | |
| 2021/0296149 A1 | 9/2021 | Green et al. | |

FOREIGN PATENT DOCUMENTS

| | | | |
|---|---|---|---|
| JP | S62222624 A | 9/1987 | |
| JP | 10165884 A | 6/1998 | |
| JP | 2008252012 A | 10/2008 | |
| JP | 2009095783 A | 5/2009 | |
| JP | 2010525608 A | 7/2010 | |
| JP | 4559317 B2 | 10/2010 | |
| JP | 2013058569 A | 3/2013 | |
| KR | 20160016409 A | 2/2016 | |
| KR | 20170095739 | 8/2017 | |
| WO | WO-9910135 A1 * | 3/1999 | ............ B23P 19/04 |
| WO | 2004059724 A1 | 7/2004 | |
| WO | 2013021645 A1 | 2/2013 | |

OTHER PUBLICATIONS

WO 9910135—Machine Translation (Year: 1999).*
International Seach Report and Written Opinion dated Sep. 1, 2020, for application No. PCT/US2020/033774.
Entegris F300 AutoPds, Wafer Carrier Clean, Secure wafer transport and optimum automation intergartion, https://www.entergris.com.
Entegris Spectra Foup, Front opening unified pod platform with superior microenvironment control, https:/www.entegris.com/content/dam/shared-product-assets/wafer-processing/datasheet-spectra-foup-2413.pdf, Retrieved May 20, 2019.
International Search Report and Written Opinion dated Jul. 9, 2021, for application No. PCT/US2021/023494.

* cited by examiner

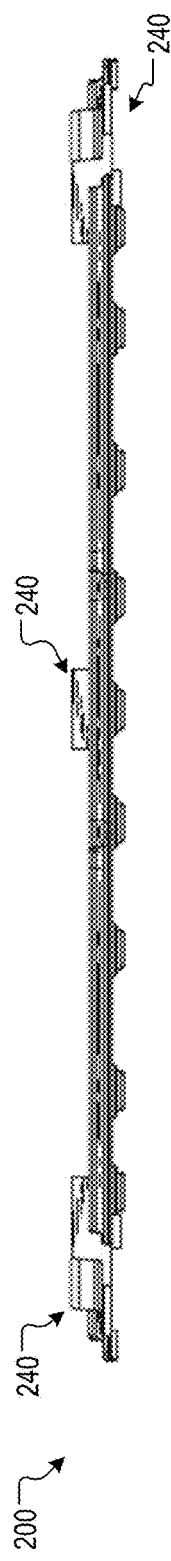
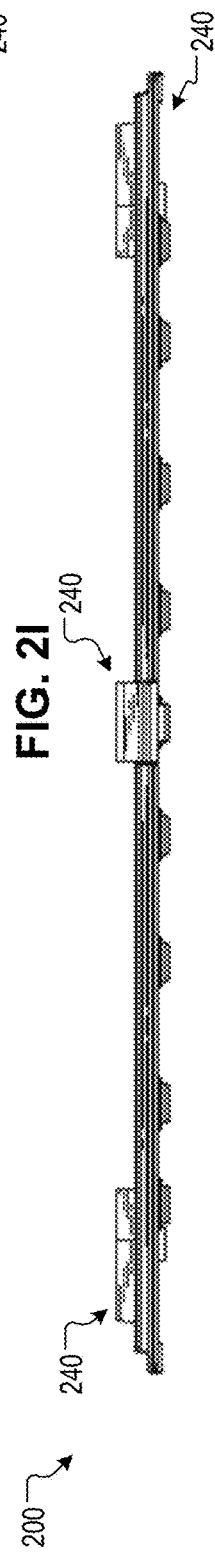
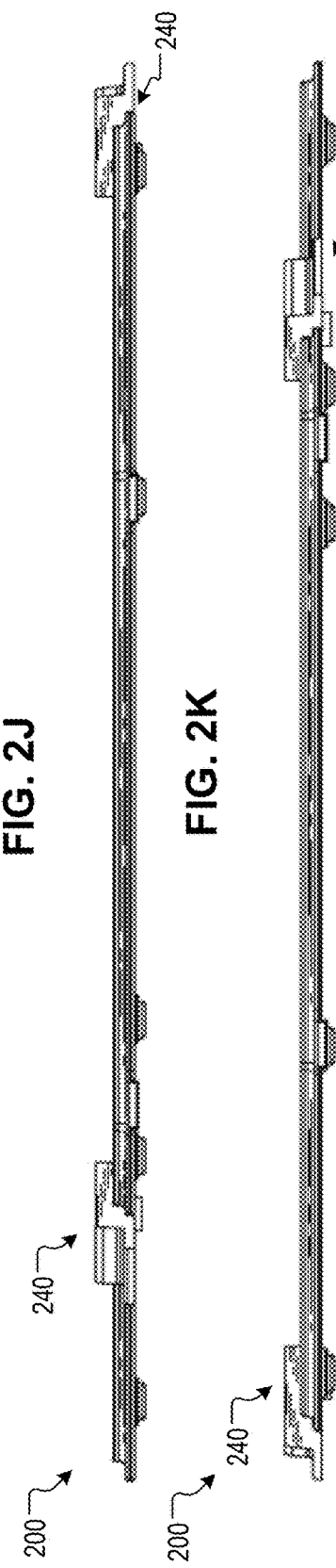
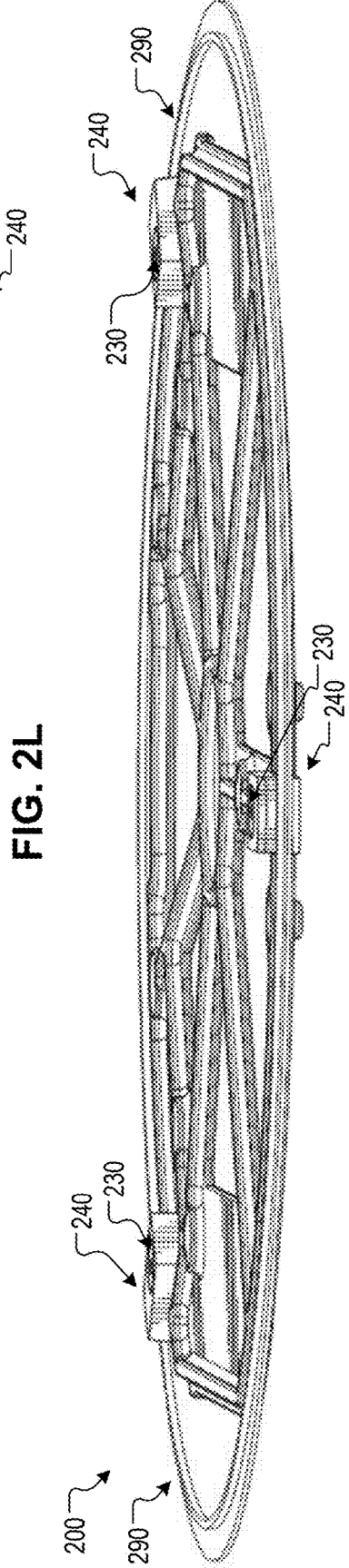
FIG. 2I  FIG. 2J  FIG. 2K  FIG. 2L  FIG. 2M

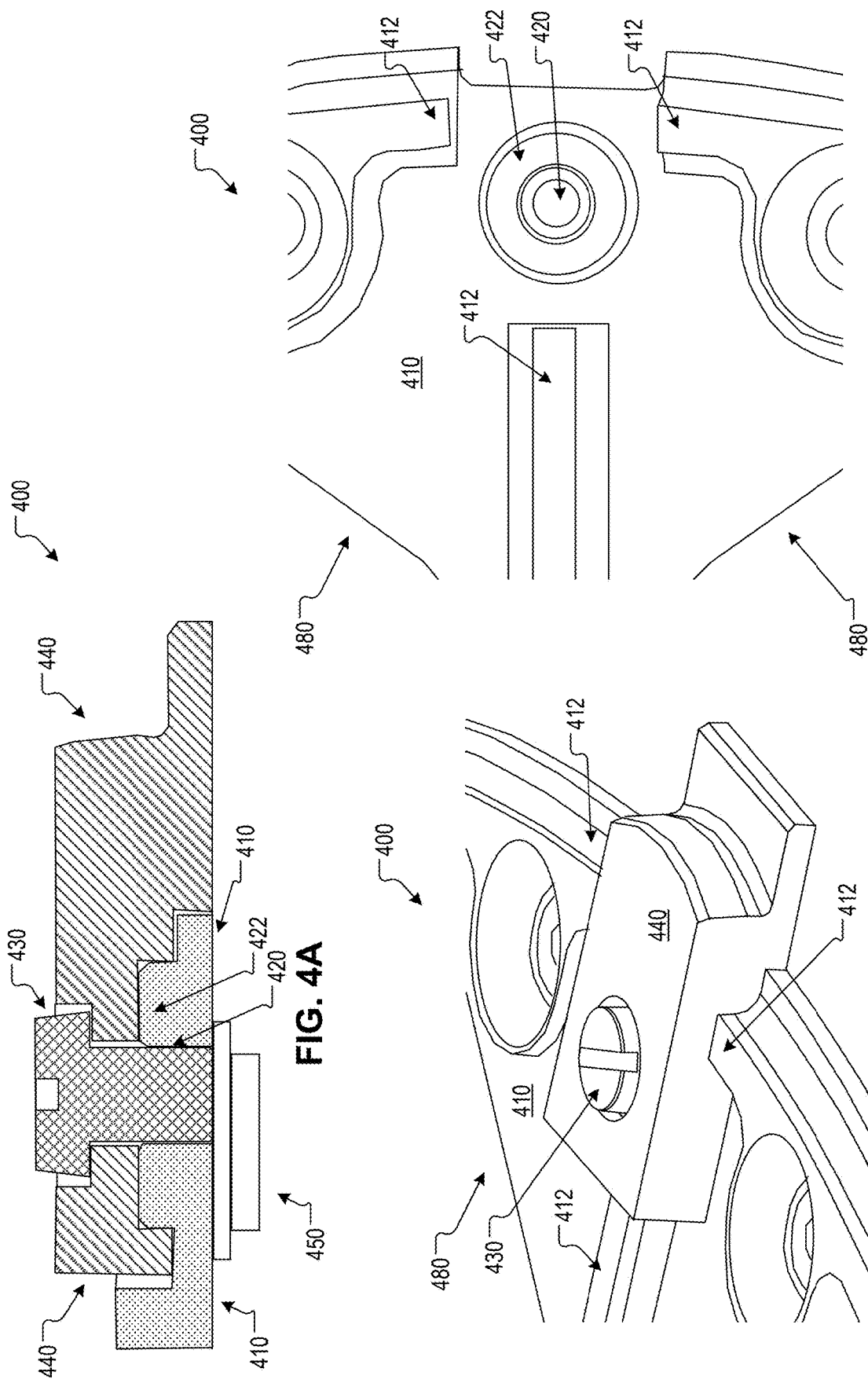

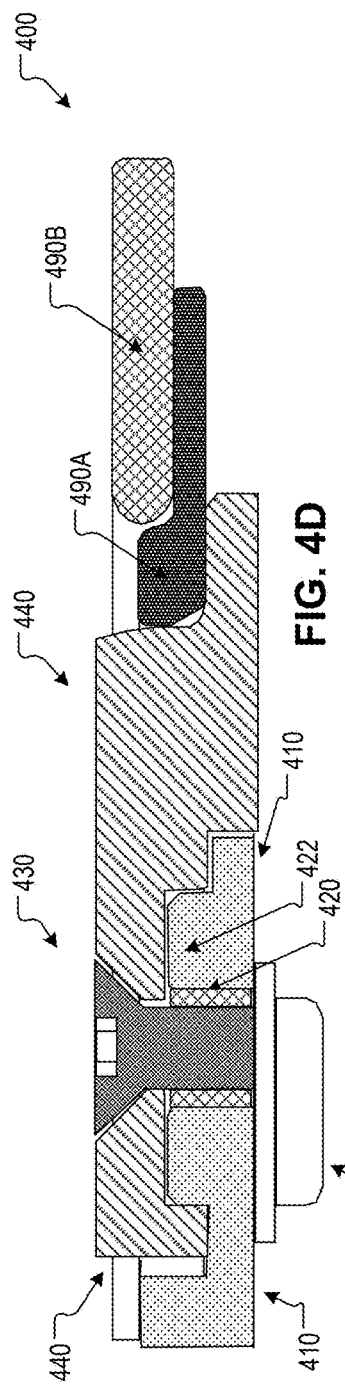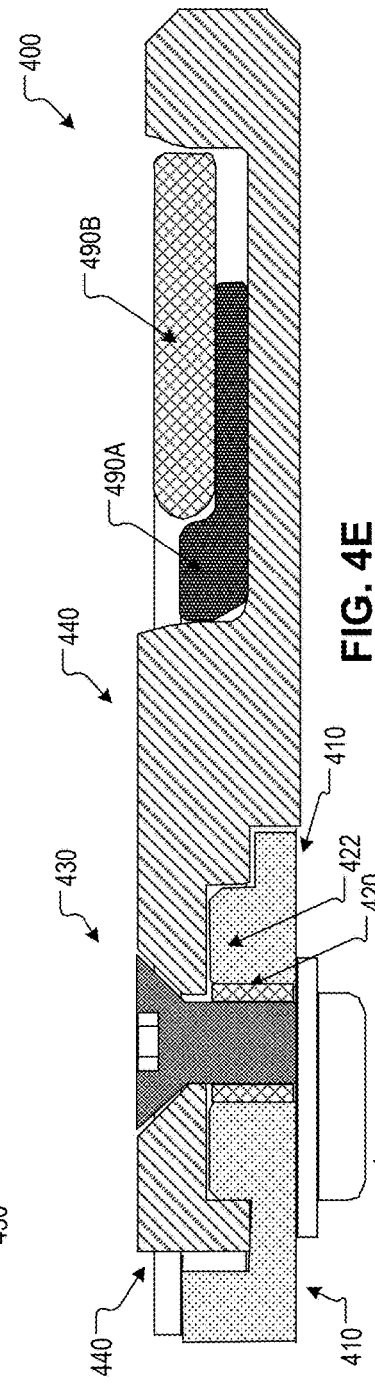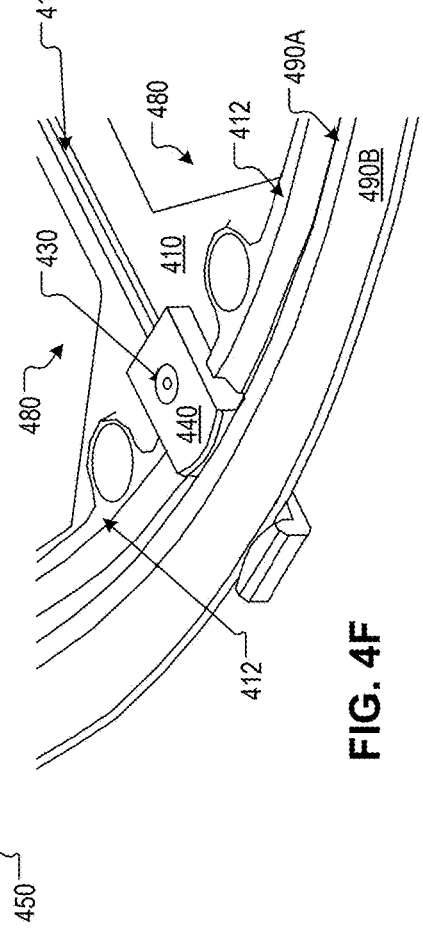
FIG. 4D
FIG. 4E
FIG. 4F

SUBSTRATE PROCESSING SYSTEM CARRIER

RELATED APPLICATION

This application claims benefit of U.S. Provisional Patent Application 62/993,528, filed Mar. 23, 2020, the entire content of which is incorporated by reference herein.

TECHNICAL FIELD

Embodiments of the present disclosure relate to apparatuses and methods for transfer of content, and in particular to a carrier for transfer of content such as process kit rings in a substrate processing system.

BACKGROUND

In semiconductor processing and other electronics processing, platforms are often used that use robotic arms to transport objects such as wafers between processing chambers, from storage areas (e.g., front opening unified pods (FOUPs)) to processing chambers, from processing chambers to storage areas, and so on.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a carrier includes a rigid body forming a plurality of openings and a plurality of fasteners configured to removably attach to the rigid body via the plurality of openings. A first set of fingers is configured to be removably attached to the rigid body via the plurality of fasteners and the plurality of openings. The first set of fingers is configured to support first content during first transportation of the carrier within a substrate processing system. A second set of fingers is configured to be removably attached to the rigid body via the plurality of fasteners and the plurality of openings. The second set of fingers is configured to support second content during second transportation of the carrier within the substrate processing system.

In another aspect of the disclosure, a finger is configured to removably attach to a carrier of a substrate processing system. The finger includes a first upper surface disposed substantially in a first plane and a second upper surface disposed substantially in a second plane that is above the first plane. The first upper surface is configured to support content during transportation of the carrier. The finger further includes a sidewall disposed between the first upper surface and the second upper surface. The finger further includes a lower surface. A first opening is formed through the finger from the second upper surface to the lower surface. The lower surface forms a recess to receive a portion of the carrier forming a second opening. The finger is to attach to the carrier via a fastener inserted through the first opening of the finger and the second opening of the carrier.

In another aspect of the disclosure, a method includes determining first conditions associated with first transportation in a substrate processing system and identifying a first set of fingers corresponding to the first conditions. The method further includes attaching the first set of fingers to a rigid body of a carrier via a plurality of fasteners and placing first content on the first set of fingers to be transported in the substrate processing system via the carrier.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 4A-F illustrate fingers and fasteners of carriers, according to certain embodiments.

DETAILED DESCRIPTION OF EMBODIMENTS

Figure 1:
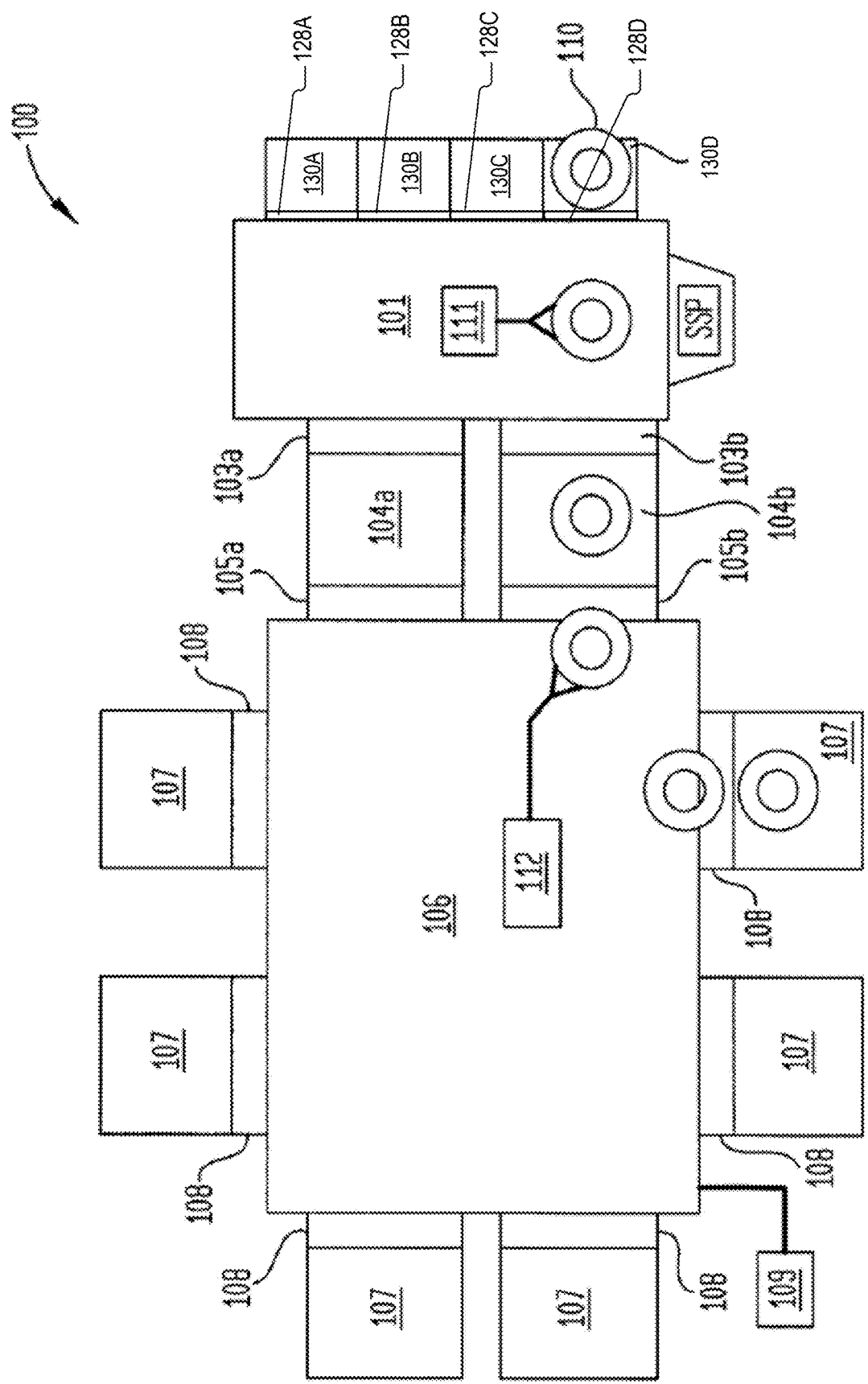
FIG. 1 illustrates a processing system, according to certain embodiments.

Embodiments described herein are related to a substrate processing system carrier. Particular embodiments are related to a carrier configured to carry a process kit ring (e.g., an edge ring) and/or other chamber component between stations in a substrate processing system. The carrier is picked up, moved, and placed by robot arms that are configured to pick up, move and place substrates such as wafers. The carrier enables other types of objects such as process kit rings to be handled by robot arms configured to the handling of substrates.

A processing system, such as a wafer processing system, has one or more processing chambers for processing of substrates. A gas is used to etch a substrate in a processing chamber (e.g., a substrate is etched while electrostatically clamped in position in an etch chamber). A substrate support assembly includes one or more process kit rings that generally surround a substrate (e.g., to protect one or more portions of the processing chamber, the substrate, etc.). For example, a circular part, referred to as an edge ring or process kit ring, is positioned immediately outside of the outer diameter of the substrate to protect the upper surface of a chuck (e.g., an electrostatic chuck) supporting the substrate from being etched by etchant chemistry. Process kit rings are made from several different materials and can have different shapes, both which affect process uniformity near the process kit ring. During processing, process kit rings and other components of processing chambers are etched over time and result in shape changes as well as changes in processing uniformity.

To address the changes in processing uniformity due to deterioration of process kit rings and other components, process kit rings and other components are replaced. Some components, such as process kit rings, are replaced according to a schedule. Conventionally, to replace a component, such as a process kit ring, an operator opens a processing chamber to have access to the component inside, manually removes and replaces the component, and closes the processing chamber. While the processing chamber is open, the processing chamber and the processing system can become contaminated with cells, hair, dust, etc. After being opened, the processing chamber and/or processing system then goes through a requalification process that removes the processing chamber and/or processing system from operation for days to weeks. The requalification process impacts line yield, scheduling, quality (e.g., responsive to adding variables to the system), user time, energy used, and so forth.

The devices, systems, and methods disclosed herein provide a substrate processing system carrier (also referred to herein as a chamber component carrier, or simply carrier). The carrier enables automated replacement of different types of content in different types of conditions (e.g., without opening a process chamber, while maintaining a sealed environment). A carrier includes a rigid body forming openings and fasteners configured to removably attach to the rigid body via the openings. A first set of fingers (e.g., three fingers) is configured to be removably attached to the rigid body via the fasteners and the openings. The first set of fingers is configured to support first content during first transportation (e.g., via a robot arm) of the carrier within a substrate processing system. A second set of fingers (e.g., three fingers) is configured to be removably attached to the rigid body via the fasteners and openings. The second set of fingers is configured to support second content during second transportation (e.g., via the robot arm) of the carrier within the substrate processing system. In some embodiments, the first content and the second content are different types of content. In some examples, content includes one or more of a new process kit ring, a used process kit ring, a new chamber component of the substrate processing system, a used chamber component of the substrate processing system, or the like.

In some embodiments, the first transportation and the second transportation are in different conditions. In some embodiments, each finger of the first set of fingers includes a first material configured for first conditions and each finger of the second set of fingers includes a second material configured for second conditions that are different than the first conditions. In some examples, conditions include one or more of corrosive conditions, clean conditions, electrostatic conditions, high temperature, high pressure, atmospheric, vacuum, or the like.

In some embodiments, each finger has a first upper surface, a second upper surface, a sidewall, and a lower surface. The first upper surface is disposed substantially in a first plane and is configured to support content during transportation of the carrier. The second upper surface is disposed substantially in a second plane that is above the first plane. The sidewall is disposed between the first upper surface and the second upper surface. A first opening is formed through the finger from the second upper surface to the lower surface. The lower surface forms a recess to receive a portion of the carrier forming a second opening. The finger is to removably attach to the carrier via a fastener inserted through the first opening of the finger and the second opening of the carrier. In some embodiments, the content contacts the set of fingers without contacting the rigid body during transportation of the carrier. In some embodiments, the openings formed by the rigid body are slots and each finger is adjustably located on the rigid body via the slots. In some examples, the location of the fingers are adjusted based on wear of the fingers. In some examples, the location of the fingers are adjusted based on the type (e.g., size, etc.) of the content to be transported by the carrier.

In some embodiments, the sidewall of the finger has an upper portion that has about a 100 to 110 degree angle (e.g., about 15 degrees from orthogonal) and a lower portion that has about a 90 to 100 degree angle (e.g., about 5 degrees from orthogonal) relative to the first upper surface. In some embodiments, the finger further includes a chamfer between the first upper surface and the sidewall. In some embodiments, the finger is configured to dissipate electrostatic charge.

The carrier (e.g., rigid body) includes one or more lower surfaces configured to interface with an end effector of a robot arm. The carrier (e.g., rigid body) includes one or more lower surfaces (e.g., solid planar central region) configured to interface with a vacuum chuck.

The devices, systems, and methods disclosed herein have advantages over conventional solutions. The substrate processing system carrier enables automated replacement of different types of content in different types of conditions without opening of a process chamber and without a subsequent requalification process. The substrate processing system carrier is configured to interface with equipment used for transfer of wafers (e.g., end effector on a robot arm, vacuum chuck, lift pins, etc.). Use of the substrate processing system carrier enables wafer handling components (e.g., vacuum chucks, end effectors, robot arms, slit valves, load ports, etc.) of a wafer processing system to also handle process kit rings and other components without adaptation or with minimal adaptation. Use of the substrate processing system carrier to replace components has less impact on line yield, scheduling, substrate quality, user time, energy used, and so forth than conventional solutions. Additionally, use of the substrate processing system carrier enables robots and/or stations configured for handling substrates to also handle other types of objects (e.g., chamber components) without retooling. This can reduce the total cost of ownership of substrate processing systems.

Although portions of the present description refer to process kit rings, the present description can be applied to different types of content (e.g., to different types of chamber components, such as an edge ring, a showerhead, a mask, a mask handler, a half ring, or the like, in addition to process kit rings). Although portions of the present description refer to substrate processing systems, the present description can be applied to other types of systems.

FIG. 1 illustrates a processing system 100 (e.g., wafer processing system, substrate processing system, semiconductor processing system) according to certain embodiments. The processing system 100 includes a factory interface 101 and load ports 128 (e.g., load ports 128A-D). In some embodiments, the load ports 128A-D are directly mounted to (e.g., seal against) the factory interface 101. Enclosure systems 130 (e.g., cassette, FOUP, process kit enclosure system, or the like) are configured to removably couple (e.g., dock) to the load ports 128A-D. Referring to FIG. 1, enclosure system 130A is coupled to load port 128A, enclosure system 130B is coupled to load port 128B, enclosure system 130C is coupled to load port 128C, and enclosure system 130D is coupled to load port 128D. In some embodiments, one or more enclosure systems 130 are coupled to the load ports 128 for transferring wafers and/or other substrates into and out of the processing system 100. Each of the enclosure systems 130 seal against a respective load port 128. In some embodiments, a first enclosure system 130A is docked to a load port 128A (e.g., for replacing used process kit rings). Once such operation or operations are performed, the first enclosure system 130A is then undocked from the load port 128A, and then a second enclosure system 130 (e.g., a FOUP containing wafers) is docked to the same load port 128A. In some embodiments, a carrier (e.g., configured to use different types of fingers) is used to transport different types of content between the enclosure systems 130 and other portions of the processing system 100.

In some embodiments, a load port 128 includes a front interface that forms a vertical opening (or a substantially vertical opening). The load port 128 additionally includes a horizontal surface for supporting an enclosure system 130 (e.g., cassette, process kit enclosure system). Each enclosure system 130 (e.g., FOUP of wafers, process kit enclosure system) has a front interface that forms a vertical opening. The front interface of the enclosure system 130 is sized to interface with (e.g., seal to) the front interface of the load port 128 (e.g., the vertical opening of the enclosure system 130 is approximately the same size as the vertical opening of the load port 128). The enclosure system 130 is placed on the horizontal surface of the load port 128 and the vertical opening of the enclosure system 130 aligns with the vertical opening of the load port 128. The front interface of the enclosure system 130 interconnects with (e.g., clamp to, be secured to, be sealed to) the front interface of the load port 128. A bottom plate (e.g., base plate) of the enclosure system 130 has features (e.g., load features, such as recesses or receptacles, that engage with load port kinematic pin features, a load port feature for pin clearance, and/or an enclosure system docking tray latch clamping feature) that engage with the horizontal surface of the load port 128. The same load ports 128 that are used for different types of enclosure systems 130 (e.g., process kit enclosure system, cassettes that contain wafers, etc.).

In some embodiments, the enclosure system 130 (e.g., process kit enclosure system) includes one or more items of content 110 (e.g., one or more of a process kit ring, an empty process kit ring carrier, a process kit ring disposed on a process kit ring carrier, a placement validation wafer, component of the processing system 100, etc.). In some examples, the enclosure system 130 is coupled to the factory interface 101 (e.g., via load port 128) to enable automated transfer of a process kit ring on a process kit ring carrier into the processing system 100 for replacement of a used process kit ring.

In some embodiments, the processing system 100 also includes first vacuum ports 103a, 103b coupling the factory interface 101 to respective degassing chambers 104a, 104b. Second vacuum ports 105a, 105b are coupled to respective degassing chambers 104a, 104b and disposed between the degassing chambers 104a, 104b and a transfer chamber 106 to facilitate transfer of wafers and content 110 (e.g., process kit rings) into the transfer chamber 106. In some embodiments, a processing system 100 includes and/or uses one or more degassing chambers 104 and a corresponding number of vacuum ports 103, 105 (e.g., a processing system 100 includes a single degassing chamber 104, a single first vacuum port 103, and a single second vacuum port 105). The transfer chamber 106 includes a plurality of processing chambers 107 (e.g., four processing chambers 107, six processing chambers 107, etc.) disposed therearound and coupled thereto. The processing chambers 107 are coupled to the transfer chamber 106 through respective ports 108, such as slit valves or the like. In some embodiments, the factory interface 101 is at a higher pressure (e.g., atmospheric pressure) and the transfer chamber 106 is at a lower pressure (e.g., vacuum). Each degassing chamber 104 (e.g., load lock, pressure chamber) has a first door (e.g., first vacuum port 103) to seal the degassing chamber 104 from the factory interface 101 and a second door (e.g., second vacuum port 105) to seal the degassing chamber 104 from the transfer chamber 106. Content is to be transferred from the factory interface 101 into a degassing chamber 104 while the first door is open and the second door is closed, the first door is to close, the pressure in the degassing chamber 104 is to be reduced to match the transfer chamber 106, the second door is to open, and the content is to be transferred out of the degassing chamber 104. A local center finding (LCF) device is to be used to align the content in the transfer chamber 106 (e.g., before entering a processing chamber 107, after leaving the processing chamber 107).

In some embodiments, the processing chambers 107 includes or more of etch chambers, deposition chambers (including atomic layer deposition, chemical vapor deposition, physical vapor deposition, or plasma enhanced versions thereof), anneal chambers, or the like.

Factory interface 101 includes a factory interface robot 111. Factory interface robot 111 includes a robot arm, such as a selective compliance assembly robot arm (SCARA) robot. Examples of a SCARA robot include a 2 link SCARA robot, a 3 link SCARA robot, a 4 link SCARA robot, and so on. The factory interface robot 111 includes an end effector on an end of the robot arm. The end effector is configured to pick up and handle specific objects, such as wafers. Alternatively, or additionally, the end effector is configured to handle objects such as a carrier and/or process kit rings (edge rings). The robot arm has one or more links or members (e.g., wrist member, upper arm member, forearm member, etc.) that are configured to be moved to move the end effector in different orientations and to different locations.

The factory interface robot 111 is configured to transfer objects between enclosure systems 130 (e.g., cassettes, FOUPs) and degassing chambers 104a, 104b (or load ports). While conventional systems are associated with opening of (e.g., disassembly of, breaking the seal of, contaminating) a processing system (e.g., factory interface, transfer chamber, processing chamber) to replace different types of content, the processing system 100 is configured to facilitate transfer and replacement of content without opening of (e.g., disassembly of, breaking the seal of, contaminating) the processing system 100 by an operator. Accordingly, in some embodiments, a sealed environment including an interior volume of an enclosure system 130 and an internal volume of the factory interface 101 are maintained during the replacement of content (e.g., via a carrier with replaceable fingers).

Transfer chamber 106 includes a transfer chamber robot 112. Transfer chamber robot 112 includes a robot arm with an end effector at an end of the robot arm. The end effector is configured to handle particular objects, such as wafers. In some embodiments, the transfer chamber robot 112 is a SCARA robot, but has fewer links and/or fewer degrees of freedom than the factory interface robot 111 in some embodiments.

A controller 109 controls various aspects of the processing system 100. The controller 109 is and/or includes a computing device such as a personal computer, a server computer, a programmable logic controller (PLC), a microcontroller, and so on. The controller 109 includes one or more processing devices, which, in some embodiments, are general-purpose processing devices such as a microprocessor, central processing unit, or the like. More particularly, in some embodiments, the processing device is a complex instruction set computing (CISC) microprocessor, reduced instruction set computing (RISC) microprocessor, very long instruction word (VLIW) microprocessor, or a processor implementing other instruction sets or processors implementing a combination of instruction sets. In some embodiments, the processing device is one or more special-purpose processing devices such as an application specific integrated circuit (ASIC), a field programmable gate array (FPGA), a digital signal processor (DSP), network processor, or the like. In some embodiments, the controller 109 includes a data storage device (e.g., one or more disk drives and/or solid state drives), a main memory, a static memory, a network interface, and/or other components. In some embodiments, the controller 109 executes instructions to perform any one or more of the methods or processes described herein. The instructions are stored on a computer readable storage medium, which include one or more of the main memory, static memory, secondary storage and/or processing device (during execution of the instructions). The controller 109 receives signals from and sends controls to factory interface robot 111 and wafer transfer chamber robot 112 in some embodiments.

FIG. 1 schematically illustrates transfer of content 110 (e.g., a process kit ring coupled to a process kit ring carrier) into a processing chamber 107. According to one aspect of the disclosure, content 110 is removed from an enclosure system 130 via factory interface robot 111 located in the factory interface 101. The factory interface robot 111 transfers the content 110 through one of the first vacuum ports 103a, 103b and into a respective degassing chamber 104a, 104b. A transfer chamber robot 112 located in the transfer chamber 106 removes the content 110 from one of the degassing chambers 104a, 104b through a second vacuum port 105a or 105b. The transfer chamber robot 112 moves the content 110 into the transfer chamber 106, where the content 110 is transferred to a processing chamber 107 though a respective port 108. While not shown for clarity in FIG. 1, transfer of the content 110 includes transfer of a process kit ring disposed on a process kit ring carrier, transfer of an empty process kit ring carrier, transfer of a placement validation wafer, etc.

FIG. 1 illustrates one example of transfer of content 110, however, other examples are also contemplated. In some examples, it is contemplated that the enclosure system 130 is coupled to the transfer chamber 106 (e.g., via a load port mounted to the transfer chamber 106). From the transfer chamber 106, the content 110 is to be loaded into a processing chamber 107 by the transfer chamber robot 112. Additionally, in some embodiments, content 110 is loaded in a substrate support pedestal (SSP). In some embodiments, an additional SSP is positioned in communication with the factory interface 101 opposite the illustrated SSP. Processed content 110 (e.g., a used process kit ring) is to be removed from the processing system 100 in reverse of any manner described herein. When utilizing multiple enclosure systems 130 or a combination of enclosure system 130 and SSP, in some embodiments, one SSP or enclosure system 130 is to be used for unprocessed content 110 (e.g., new process kit rings), while another SSP or enclosure system 130 is to be used for receiving processed content 110 (e.g., used process kit rings).

The processing system 100 includes chambers, such as factory interface 101 (e.g., equipment front end module (EFEM)) and adjacent chambers (e.g., load port 128, enclosure system 130, SSP, degassing chamber 104 such as a loadlock, or the like) that are adjacent to the factory interface 101. One or more of the chambers is sealed (e.g., each of the chambers is sealed). The adjacent chambers are sealed to the factory interface 101. In some embodiments, inert gas (e.g., one or more of nitrogen, argon, neon, helium, krypton, or xenon) is provided into one or more of the chambers (e.g., the factory interface 101 and/or adjacent chambers) to provide one or more inert environments. In some examples, the factory interface 101 is an inert EFEM that maintains the inert environment (e.g., inert EFEM minienvironment) within the factory interface 101 so that users do not need to enter the factory interface 101 (e.g., the processing system 100 is configured for no manual access within the factory interface 101).

In some embodiments, gas flow (e.g., inert gas, nitrogen) is provided into one or more chambers (e.g., factory interface 101) of the processing system 100. In some embodiments, the gas flow is greater than leakage through the one or more chambers to maintain a positive pressure within the one or more chambers. In some embodiments, the inert gas within the factory interface 101 is recirculated. In some embodiments, a portion of the inert gas is exhausted. In some embodiments, the gas flow of non-recirculated gas into the factory interface 101 is greater than the exhausted gas flow and the gas leakage to maintain a positive pressure of inert gas within the factory interface 101. In some embodiments, the factory interface 101 is coupled to one or more valves and/or pumps to provide the gas flow into and out of the factory interface 101. A processing device (e.g., of controller 109) controls the gas flow into and out of the factory interface 101. In some embodiments, the processing device receives sensor data from one or more sensors (e.g., oxygen sensor, moisture sensor, motion sensor, door actuation sensor, temperature sensor, pressure sensor, etc.) and determines, based on the sensor data, the flow rate of inert gas flowing into and/or out of the factory interface 101.

The enclosure system 130 allows for transfer and replacement of different types of content 110 (e.g., via a carrier with replaceable fingers) without opening the sealed environment within the factory interface 101 and adjacent chambers. The enclosure system 130 seals to the load port 128 responsive to being docked on the load port 128. The enclosure system 130 provides purge port access so that the interior of the enclosure system 130 can be purged prior to opening the enclosure system 130 to minimize disturbance of the inert environment within the factory interface 101.

Figure 2A:
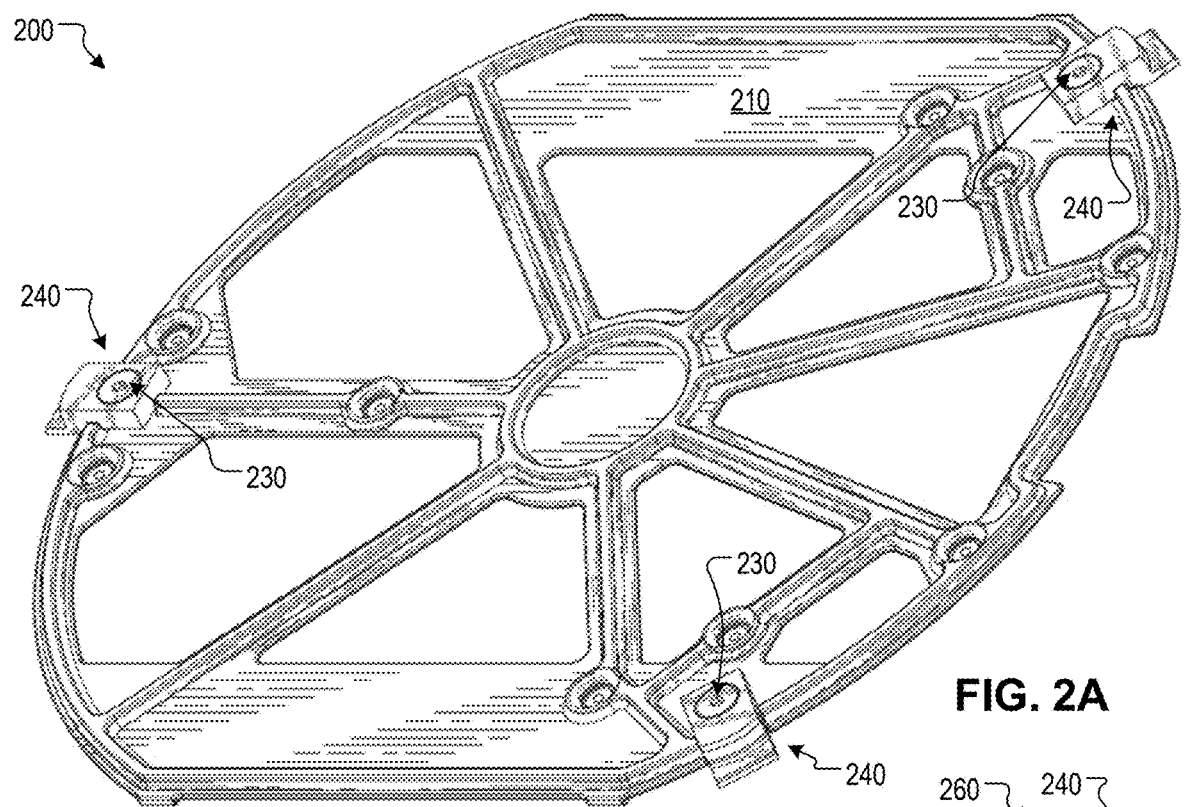
FIGS. 2A-N illustrate views of a carrier, according to certain embodiments.
Figure 2B:
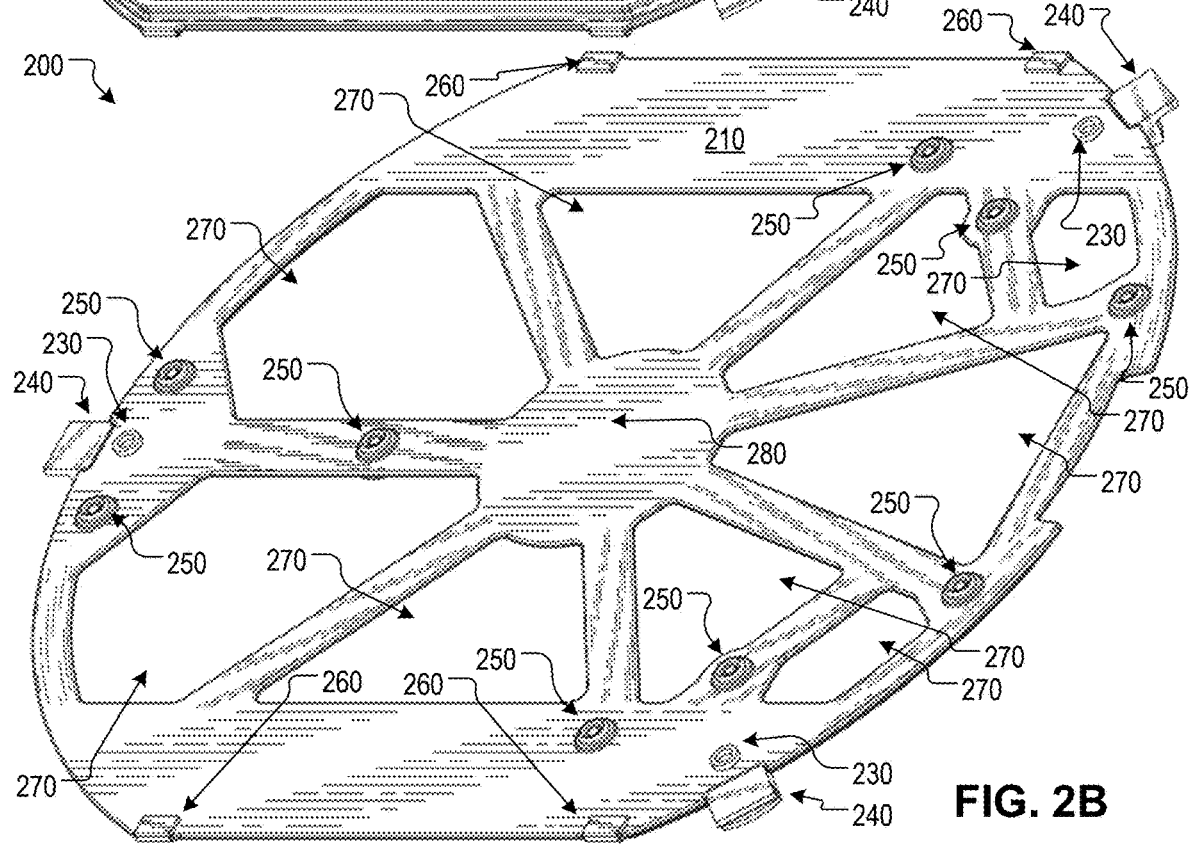
Figure 2C:
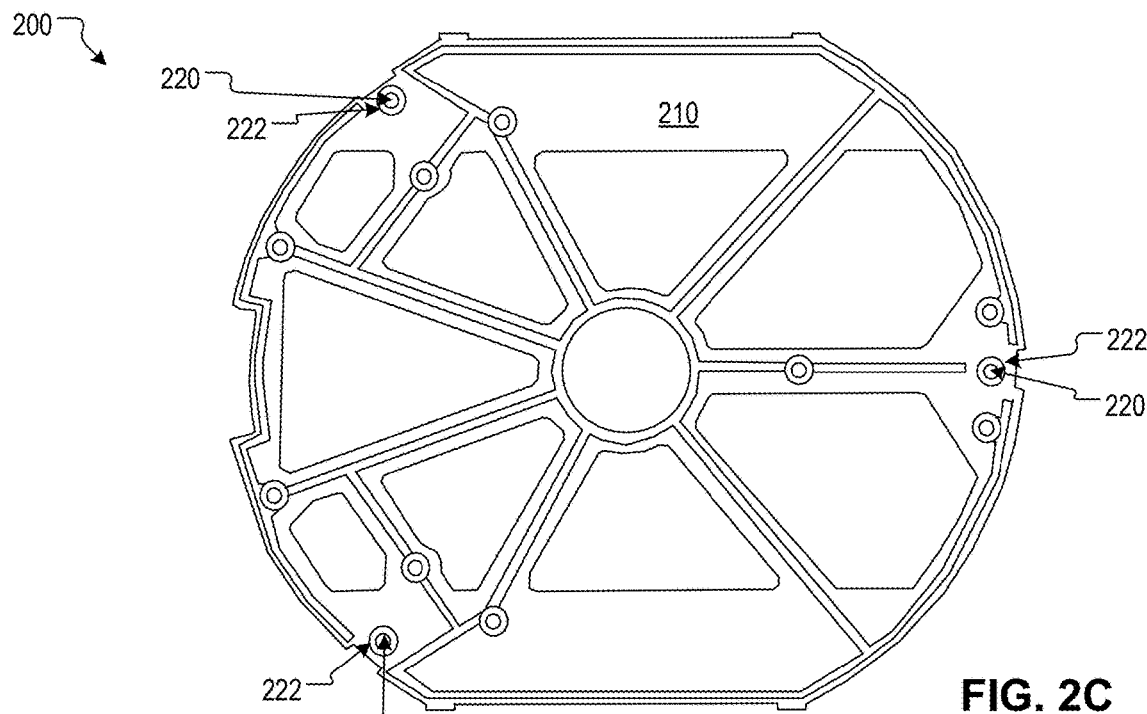
Figure 2D:
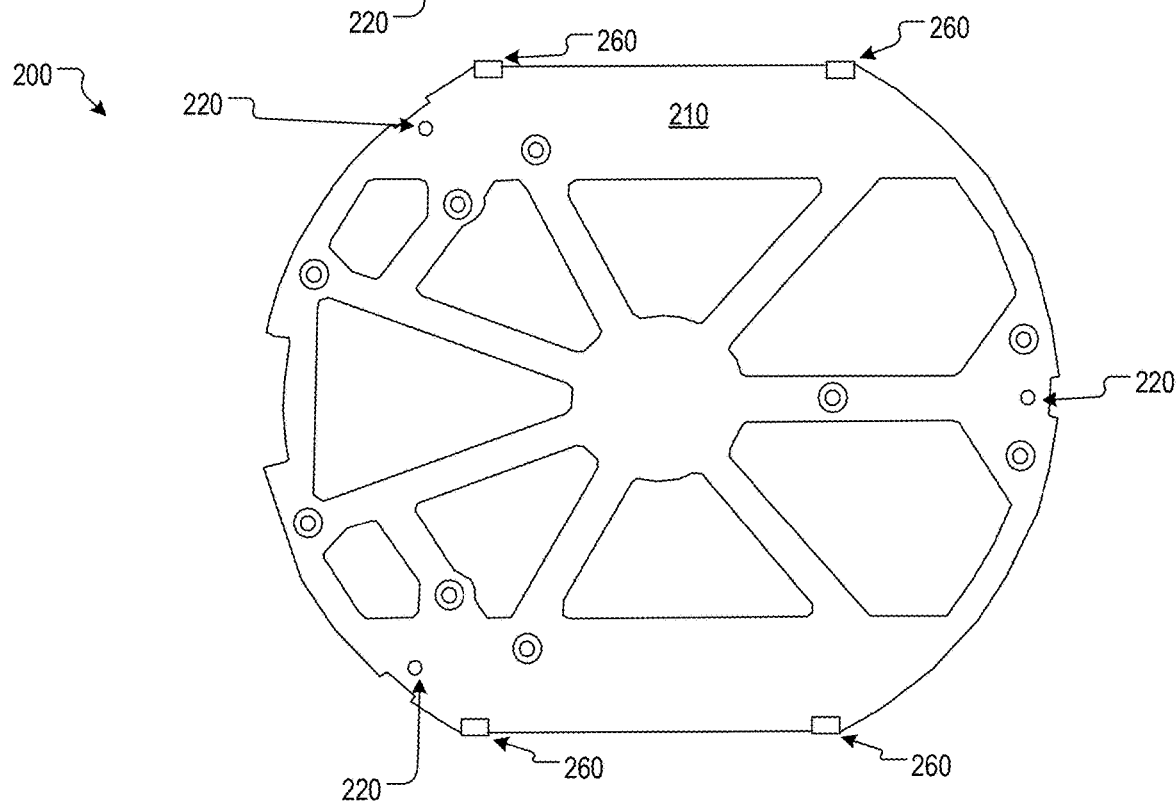
Figure 2E:
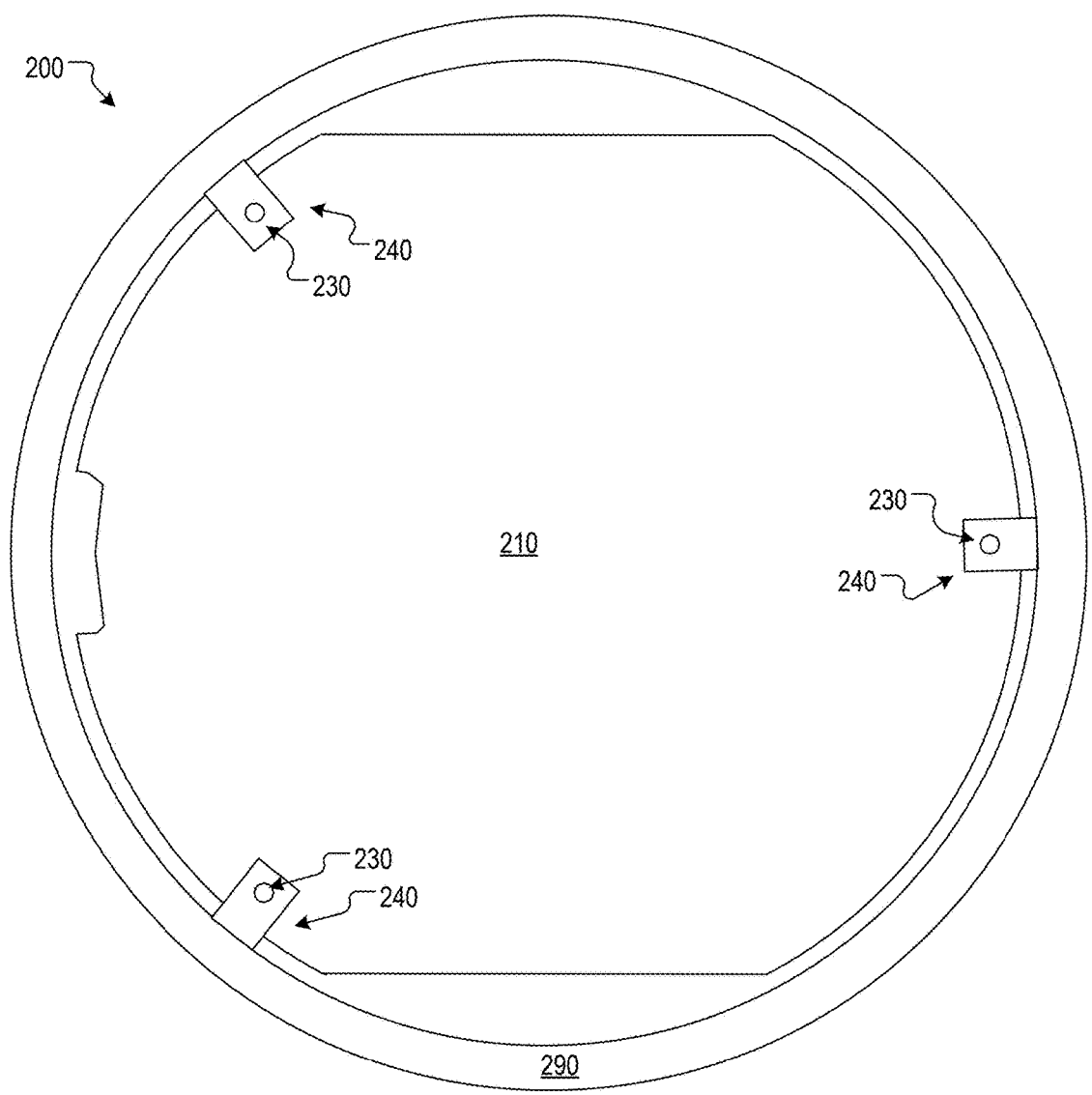
Figure 2F:
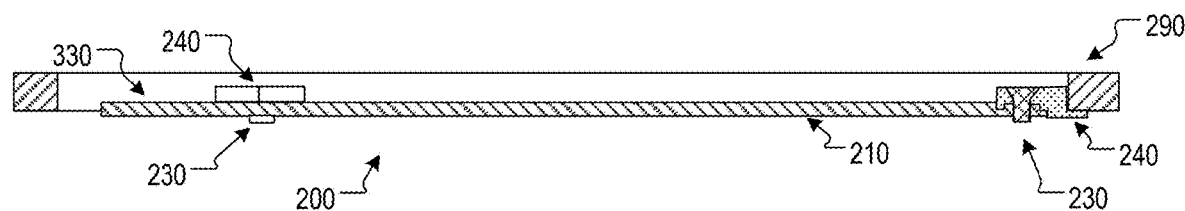
Figure 2G:
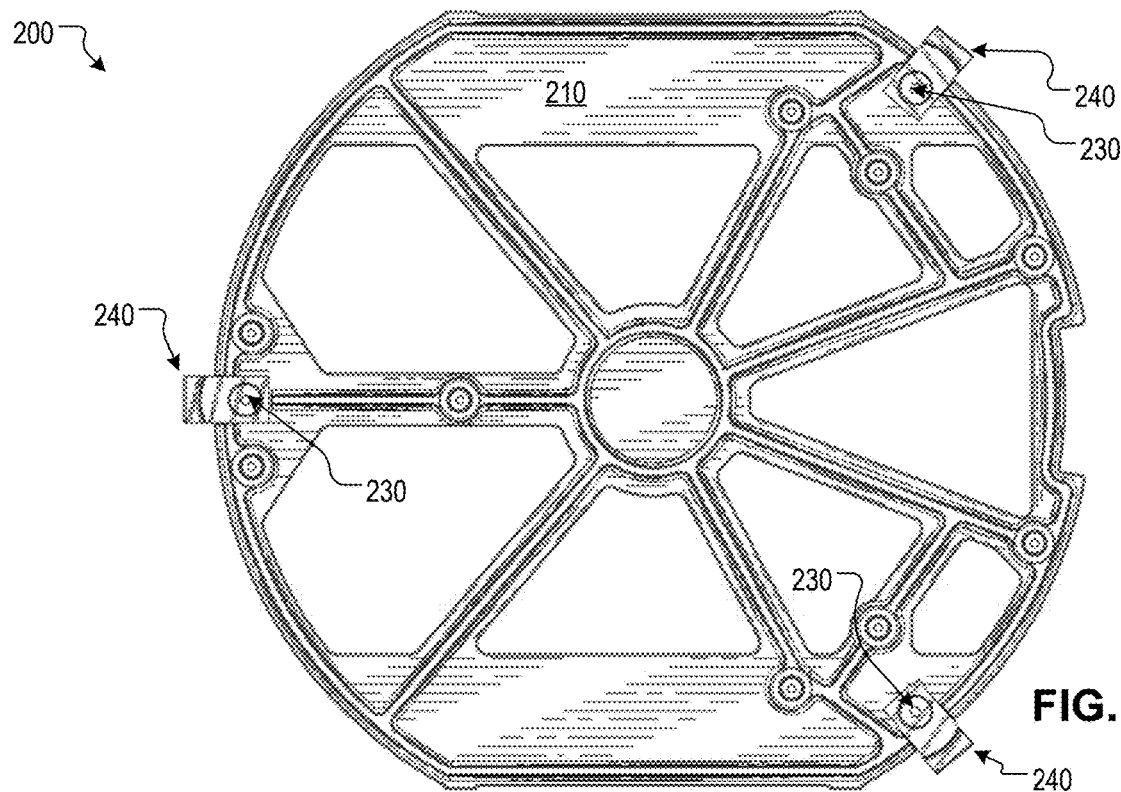
Figure 2H:
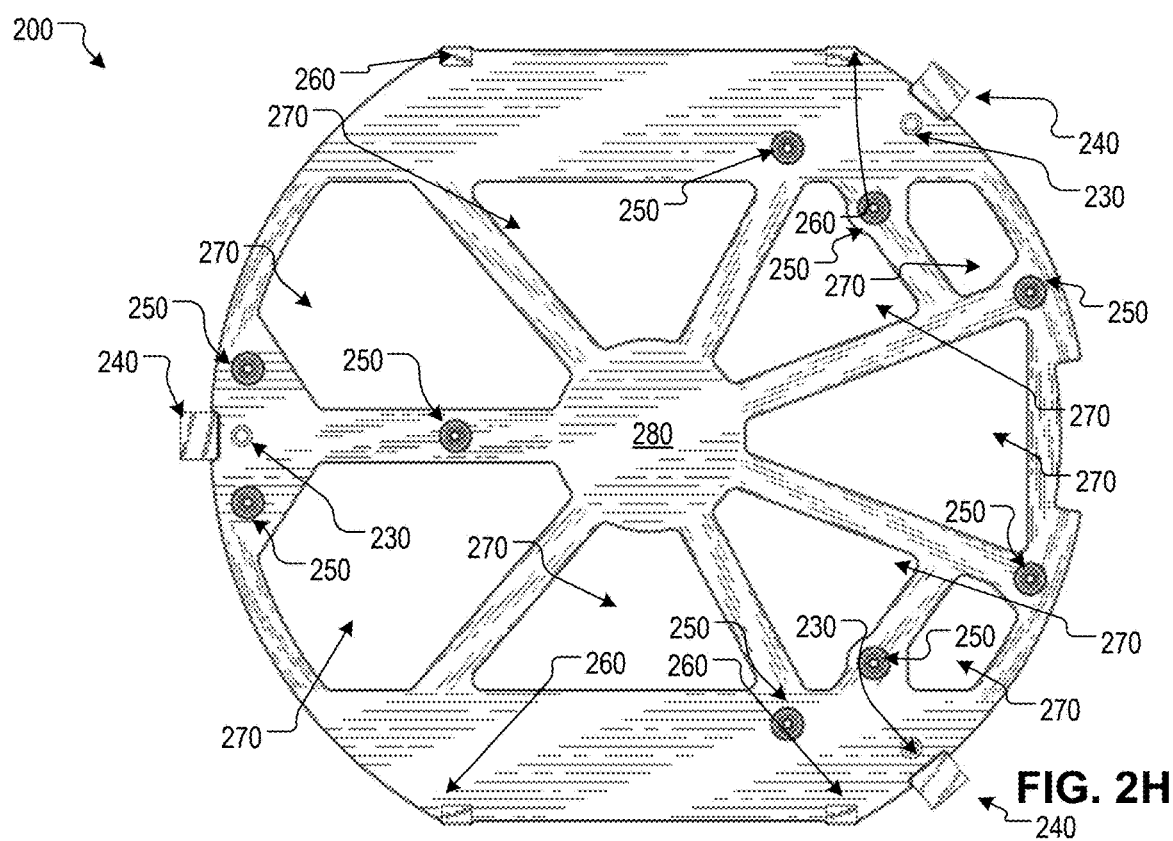
Figure 2N:
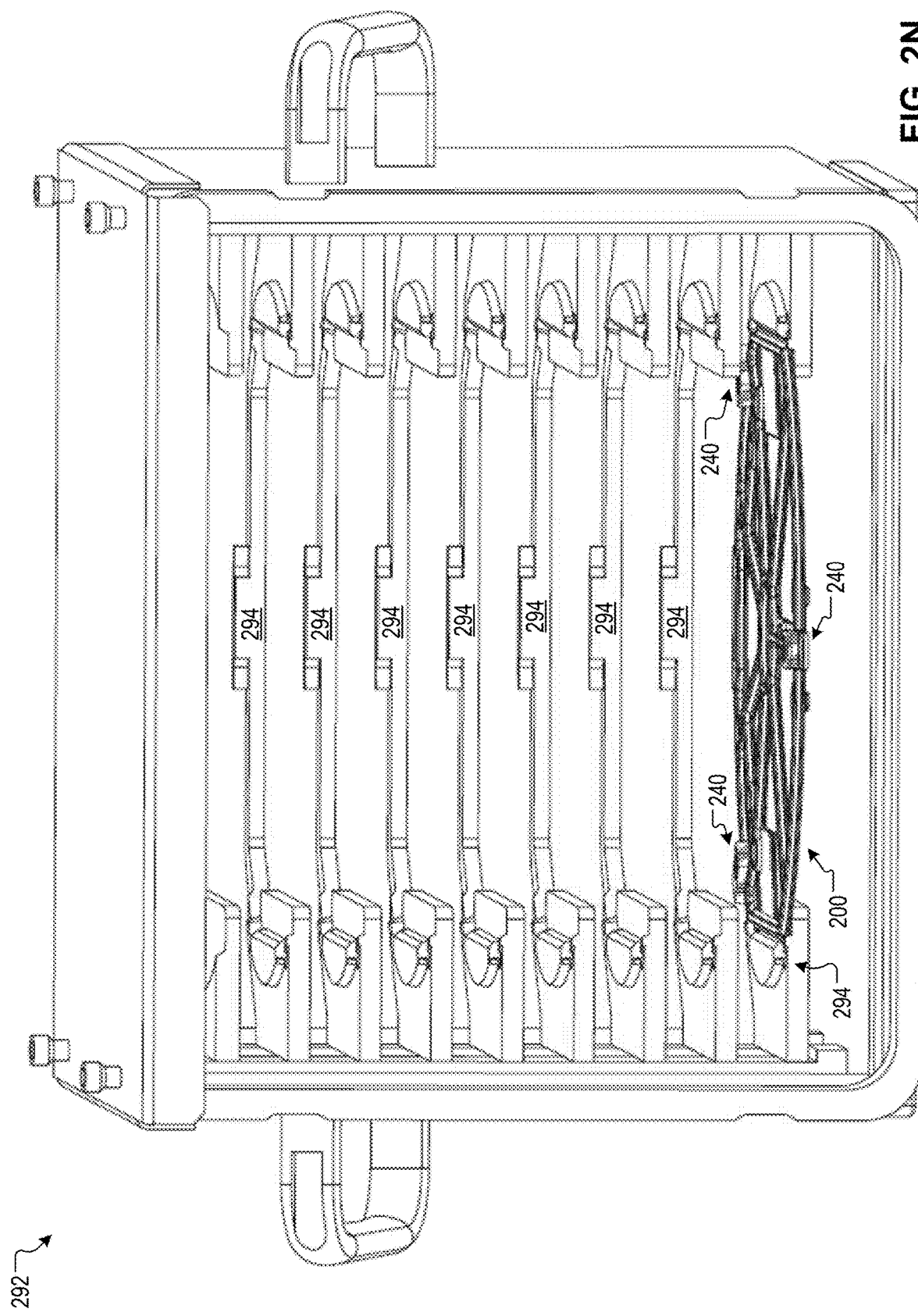

FIGS. 2A-N illustrate views of a carrier 200, according to certain embodiments.

FIGS. 2A-D and 2G-L illustrate views of a carrier 200. FIG. 2A illustrates a top perspective view of the carrier 200 including a rigid body 210, fasteners 230, and fingers 240, according to certain embodiments. FIG. 2B illustrates a bottom perspective view of the carrier 200 including a rigid body 210, fasteners 230, and fingers 240, according to certain embodiments. FIG. 2C illustrates a top view of a rigid body 210 of the carrier 200 (e.g., without fasteners 230 and fingers 240), according to certain embodiments. FIG. 2D illustrates a bottom view of the rigid body 210 of the carrier 200 (e.g., without fasteners 230 and fingers 240), according to certain embodiments. FIG. 2G illustrates a top view of the carrier 200 including a rigid body 210, fasteners 230, and fingers 240, according to certain embodiments. FIG. 2H illustrates a bottom view of the carrier 200 including a rigid body 210, fasteners 230, and fingers 240, according to certain embodiments. FIG. 2I illustrates a front elevation view of the carrier 200 including a rigid body 210, fasteners 230, and fingers 240, according to certain embodiments. FIG. 2J illustrates a rear elevation view of the carrier

200 including a rigid body 210, fasteners 230, and fingers 240, according to certain embodiments. FIG. 2K illustrates a left side elevation view of the carrier 200 including a rigid body 210, fasteners 230, and fingers 240, according to certain embodiments. FIG. 2L illustrates a right side elevation view of the carrier 200 including a rigid body 210, fasteners 230, and fingers 240, according to certain embodiments.

A carrier 200 includes a rigid body 210 comprising openings 220 (e.g., see FIGS. 2C-D). In some embodiments, the openings 220 are threaded to receive a threaded fastener 230. The carrier 200 further includes fasteners 230 (e.g., screws, bolts, rivets, or the like) configured to removably attach to the rigid body 210 via the openings 220. In some embodiments, the fasteners 230 are threaded to secure to the openings 220 that are threaded. In some embodiments, the fasteners 230 are threaded to secure to the fingers 240 that are threaded. In some embodiments, each fastener 230 includes a first portion and a second portion (e.g., a bolt and a nut, etc.) that are configured to secure to each other to secure the fingers 240 to the rigid body 210.

Fingers 240 are configured to be removably attached to the rigid body 210 via the fasteners 230 and the openings 220. In some embodiments, each finger 240 forms an opening and a fastener 230 is configured to removably attach the finger 240 to the rigid body 210 by being inserted through the opening of the finger 240 and the opening 220 of the rigid body 210.

A set of fingers 240 (e.g., three fingers 240) are configured to be removably attached to the rigid body 210. The set of fingers 240 is configured to support content (e.g., a process kit ring) during transportation (e.g., via a robot arm) of the carrier within a substrate processing system. In some embodiments, the content contacts the set of fingers 240 without contacting the rigid body 210 during transportation within the substrate processing system.

In some embodiments, a first set of fingers 240 (e.g., three fingers) is configured to be removably attached to the rigid body 210 via the fasteners 230 and the openings 220 to support first content during first transportation (e.g., via a robot arm) of the carrier 200 within a substrate processing system and a second set of fingers 240 (e.g., three different fingers) are configured to be removably attached to the rigid body 210 (e.g., via the same fasteners 230 and the same openings 220 that the first set of fingers 240 used) to support second content during second transportation (e.g., via the same robot arm) of the carrier 200 within the substrate processing system.

In some embodiments, different sets of fingers 240 are used for different types of content. In some examples, the different types of content include new content and used content (e.g., a first set of fingers 240 secured to a rigid body 210 for transporting used content and a second set of fingers 240 secured to the same rigid body 210 for transporting new content). In some examples, the different types of content include different sizes and/or shapes of content (e.g., a first set of fingers 240 secured to a rigid body 210 for transporting a first size and/or shape of content and a second set of fingers 240 secured to the same rigid body 210 for transporting a different size and/or shape of content). In some examples, different types of content include one or more of a process kit ring, a chamber component of the substrate processing system, a used chamber component of the substrate processing system, a showerhead, a component with a substantially round perimeter (e.g., inside perimeter, outside perimeter), or the like.

In some embodiments, different sets of fingers 240 are used for different conditions. In some embodiments, each finger 240 of a first set of fingers 240 includes a first material configured for first conditions and each finger of a second set of fingers includes a second material configured for second conditions that are different than the first conditions. In some examples, material of a finger 240 includes one or more of polyethylene terephthalate (PET), ceramic material, polytetrafluoroethylene (PTFE) (e.g., Teflon™), ultra high molecular weight (UHMW) polyethylene, absorptive material, non-absorptive material, coated material, deformative material, electrostatic dissipative material, or the like. In some embodiments, the fingers 240 have a particular conductivity (e.g., less than perfect conductivity, some conductivity to allow dissipation at a controlled rate, preventing conductive paths of high arch discharge, dissipative range from about 105 to about 109 Ohms, etc.). In some examples, the different conditions include one or more of corrosive conditions, clean conditions, electrostatic conditions, particular processes (e.g., substrate manufacturing processes, atomic layer deposition, chemical vapor deposition, physical vapor deposition, plasma enhanced versions thereof, or the like), particular chemistries (e.g., fluorine, acid, base, or the like), a particular temperature range (e.g., high temperature), a particular pressure range (e.g., high pressure), atmospheric pressure, vacuum pressure, or the like.

In some embodiments, the carrier 200 is a customized mechanical adapter to allow handling of a process kit ring by automation to be moved through the tool that are designed for wafer handling. The replaceable fingers 240 allow for maintenance of the carrier 200 and replacement with different finger material types depending on the needs for a particular process kit ring. The carrier 200 with replaceable fingers 240 enables current process kit rings and allows for future compatibility with various sizes and material types of process kit rings.

In some embodiments, different rigid bodies 210 are used for different content and/or different conditions. In some embodiments, each rigid body 210 is made of a different type of material. In some examples, a rigid body 210 is made of one or more of carbon fiber, aluminum, aluminum cast plate (e.g., MIC-6®), hard anodized aluminum, ceramic material, titanium, or the like. In some embodiments, the rigid body 210 is the same or a similar material as a robot blade (e.g., end effector). In some embodiments, the carrier 200 does not have any glued components (e.g., no adhesive). In some embodiments, the carrier 200 does not have any thermal press fit components. In some embodiments, all features of the carrier 200 are mechanically engaged (e.g., via fasteners 230) or machined into the rigid body 210.

In some embodiments, the carrier 200 has pads 250 (e.g., mushroom pads, perfluoroelastomer pads, Kalrez® 8475 friction pads, nine Kalrez mushroom pads, calibrated mushrooms, pads integral to the rigid body 210) for non-slip interface (e.g., automation interface) with the atmosphere robot end effector (e.g., factory interface robot 111 of FIG. 1) and the vacuum robot end effector (e.g., transfer chamber robot 112 of FIG. 1). In some embodiments, the pads 250 are used for non-slip interface with one or more of an LCF device, an aligner device, or the like In some embodiments, the carrier 200 has pads 260 (e.g., aluminum pads, pads integral to the rigid body 210) for locating the carrier 200 in an enclosure system (e.g., enclosure system 130 of FIG. 1, FOUP) and load locks (e.g., degassing chamber 104 of FIG. 1).

In some embodiments, the rigid body 210 forms windows 270 (e.g., openings, slots, etc.). In some embodiments, the windows 270 are used by tool automation (e.g., by the aligner device, by the LCF device) to view through the carrier 200 (e.g., to view objects on the other side of the carrier 200) for placement accuracy. In some embodiments, the windows 270 are used to reduce the mass of the carrier 200 (e.g., rigid body 210).

In some embodiments, the rigid body 210 has a lower surface that is substantially planar (e.g., substantially flat). In some embodiments, the lower surface of the rigid body 210 is substantially flat except for the pads 250 and 260 on the lower surface of the rigid body 210. In some embodiments, the carrier 200 (e.g., rigid body 210) does not have kinematic locating features (e.g., does not have kinematic locating features on the lower surface of the rigid body 210). In some embodiment, the rigid body 210 and/or the fingers 240 have one or more coatings. In some examples, the fingers 240 have a coating configured for transportation of content in particular conditions (e.g., adapted for certain chemistries and/or processes). In some embodiments, the fingers 240 have one or more coatings that provide one or more coefficients of friction to allow the content to align on the fingers. In some examples, the sidewall of each finger 240 has a lower coefficient of friction than the first upper surface of each finger to allow the content to slide down the sidewall and stop at the first upper surface. In some examples, an upper portion of the sidewall of each finger 240 has a lower coefficient of friction than a lower portion of the sidewall of each finger 240 to allow the content to slide down the upper portion of each sidewall and slow down at the lower portion of each sidewall.

In some embodiments, the outline of the rigid body 210 is different than that shown in FIGS. 2A-D. In some embodiments, the size, shape, quantity, or the like of the openings 220 (e.g., to receive fasteners 230), pads 250, pads 260, and/or windows 270 are different than those shown in FIGS. 2A-D.

In some embodiments, the fingers 240 are machined (e.g., after assembly onto the rigid body 210, while assembled on the rigid body 210, after being removably attached to the rigid body 210 via the fasteners 230) with marks indicating the location on the carrier 200 (e.g., rigid body 210). In some examples, a first finger 240 is machined to have a first mark (e.g., first identifier) indicative of a first location on the rigid body 210, a second finger is machined to have a second mark (e.g., second identifier) indicative of a second location on the rigid body 210, and a third finger is machined to have a third mark (e.g., third identifier) indicative of a third location on the rigid body 210. In some embodiments, the different locations on the rigid body 210 are machined to have similar marks (e.g., identifiers) as those machined onto the different fingers 240. The markings on the rigid body 210 and/or fingers 240 indicate an installation pattern. In some examples, the identifiers include one or more of hashmarks (e.g., I, II, III), numbers, letters, colors, symbols, or the like. By matching identifiers on the rigid body 210 with identifiers on the fingers 240, one opening 220 of the rigid body 210 corresponds to a specific finger 240 to avoid tolerance stack (e.g., of the boss of the rigid body 210) by different fingers 240 being used for the same opening 220 of the rigid body 210. In some embodiments, any finger 240 of the set of fingers 240 can used for any given opening 220 (e.g., any boss) of the rigid body 210.

In some embodiments, one or more fingers 240 are attached to a rigid body 210 to support content. In some embodiments, two or more fingers 240 are attached to a rigid body 210 to support content. In some embodiments, three or more fingers 240 are attached to a rigid body 210 to support content. In some embodiments, each of the fingers 240 are substantially equally spaced around the rigid body 210 (e.g., about 120 degrees between each of three fingers 240). In some embodiments, a first finger 240 and a second finger 240 are symmetrically located on the rigid body 210 and a third finger 240 is equally spaced from the first finger 240 and the second finger 240.

In some embodiments, the fingers 240 support content (e.g., a process kit ring) proximate the inner perimeter (e.g., inner sidewalls) of the content. In some embodiments, the fingers 240 support content (e.g., a process kit ring) proximate an outer perimeter (e.g., outer sidewalls) of the content.

In some embodiments, different fasteners 230 are used for one or more of different rigid bodies 210, openings 220, fingers 240, conditions, or the like. In some embodiments, different fasteners 230 are one or more of different sizes, different shapes, different material, or the like. In some embodiments, the material of a fastener 230 includes one or more of aluminum, ceramic, stainless steel, electropolished (EP) stainless steel, or the like.

In some embodiments, a finger 240 has a lip that comes down to support content. In some embodiments, the fingers 240 are disposed around the rigid body 210 to support content with a circular perimeter, such as a process kit ring, a showerhead, or the like. In some embodiments, the fingers 240 are replaceable to support content of different sized perimeters. In some embodiments, the fingers 240 are attached to the rigid body 210 via slots that allow the location of the fingers 240 to be adjustable (e.g., radially from the central portion of the rigid body 210) to support content of different sized perimeters. In some embodiments, as a finger 240 is worn over time, the location of the finger 240 is adjustable (e.g., radially from the central region 280 of the rigid body 210) to continue supporting content of the same sized perimeter. In some embodiments, once finger 240 is worn and is unable to continue supporting content of the same sized perimeter, the worn finger 240 is replaced with a new finger 240.

The carrier 200 includes one or more lower surfaces (e.g., pads 250) configured to interface with an end effector of a robot arm. The carrier 200 (e.g., rigid body 210) includes one or more lower surfaces (e.g., solid planar central region 280) configured to interface with a vacuum chuck.

In some embodiments, the rigid body 210 forms a boss 222 around each opening 220. In some embodiments, a boss 222 is a protruding feature of the rigid body 210. In some embodiments, the boss 222 is used to locate a finger 240 on the rigid body 210. In some embodiments, the finger 240 has a recess that matches the protruding boss 222. In some embodiments, the boss 222 causes the finger 240 to be attached in a correct orientation on the rigid body 210.

FIGS. 2E-F and 2M illustrate views of a carrier 200 supporting a process kit ring 290, according to certain embodiments. FIG. 2E illustrates a top view of the carrier 200 supporting a process kit ring 290, according to certain embodiments. FIG. 2F illustrates a side cross-sectional view of a carrier 200 supporting a process kit ring 290, according to certain embodiments. FIG. 2M illustrates a top perspective view of the carrier 200 supporting a process kit ring 290, according to certain embodiments.

The carrier 200 includes a rigid body 210 and fingers 240 attached to the rigid body 210 via fasteners 230. The process kit ring 290 is disposed on the fingers 240.

In some embodiments, the carrier 200 is sized and shaped to provide one or more gaps between the process kit ring 290 and one or more portions of the perimeter of the carrier 200. In some embodiments, the one or more gaps are used by the aligner device and/or the LCF device for alignment of the carrier 200 and/or the process kit ring 290. In some examples, the one or more gaps enable a light beam to be used to detect a flat inner sidewall feature or other registration feature of the process kit ring 290. In some embodiments, the one or more gaps are used by the lift pins to be able to lift the process kit ring 290 off of the carrier 200 (e.g., within a processing chamber). In some embodiments, the perimeter of the carrier 200 is configured to interface with a shelf of an enclosure system (e.g., FOUP) of a substrate processing system.

FIG. 2N illustrates a carrier 200 disposed on a shelf 294 in an enclosure system 292 (e.g., FOUP), according to certain embodiments. An enclosure system 292 includes one or more shelves 294. In some embodiments, each shelf 294 is configured to receive a carrier 200 and a process kit ring 290 disposed on the carrier 200. In some embodiments, a robot arm lowers a carrier 200 supporting a process kit ring 290 onto the shelf 294 in the enclosure system 292. In some embodiments, as the robot arm lowers the carrier 200 supporting a process kit ring 290 onto the shelf 294, a first portion of the shelf 294 supports the process kit ring 290 and then a second portion of the shelf 294 supports the carrier 200 so that the process kit ring 290 is supported above the carrier 200 (e.g., the process kit ring 290 does not contact the carrier 200) on the shelf 294.

Figure 3B:
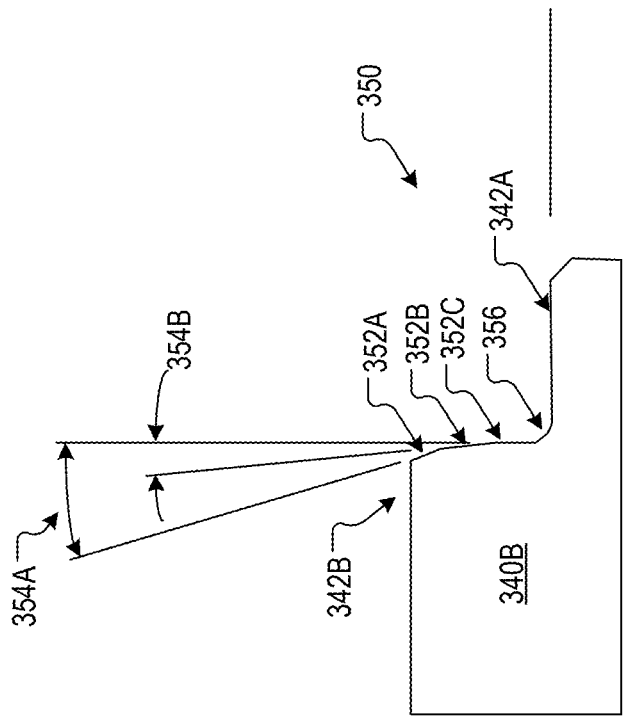
FIGS. 3A-B illustrate fingers of carriers, according to certain embodiments.
Figure 3A:
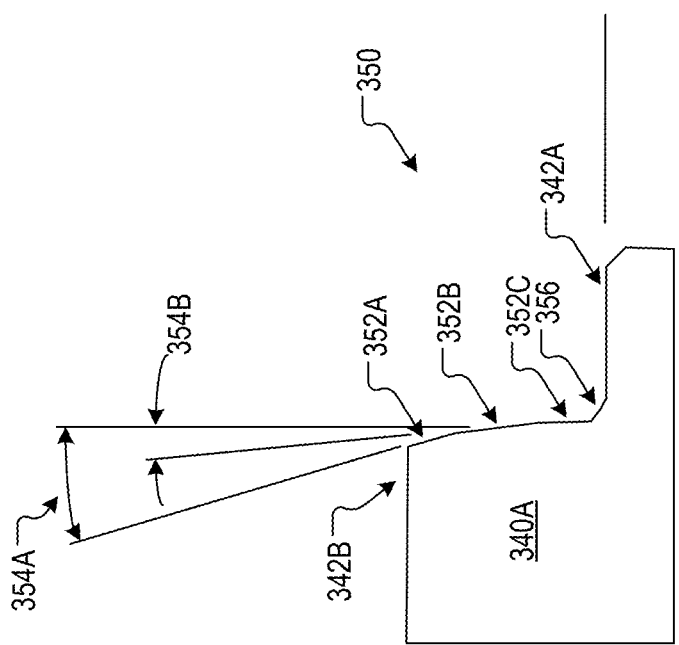

FIGS. 3A-B illustrate fingers 340A-B (e.g., finger 240 of F FIGS. 2A-F) of carriers (e.g., carriers 200 of FIGS. 2A-F), according to certain embodiments. In some embodiments finger 340A and finger 340B are configured to removably attach to the same rigid body (e.g., rigid body 210 of FIGS. 2A-F). For example, fingers 340A are configured to removably attach to a rigid body to transfer first content in first conditions and fingers 340B are configured to removably attach to the same rigid body to transfer one or more of second content different from the first content and/or in second conditions different from the first conditions.

In some embodiments, each finger 340 has a first upper surface 342A, a second upper surface 342B, a sidewall 350, and a lower surface 360. The first upper surface 342A is disposed substantially in a first plane and is configured to support content during transportation of the carrier. The second upper surface 342B is disposed substantially in a second plane that is above the first plane. The sidewall 350 is disposed between the first upper surface 342A and the second upper surface 342B. A first opening 362 is formed through the finger 340 from the second upper surface 342B to the lower surface 360. In some embodiments, the lower surface 360 forms a recess (e.g., see FIG. 4A) to receive a portion of the carrier forming a second opening (e.g., to receive the protruding boss 222 disposed around opening 220 of the rigid body 210 of FIGS. 2A-F). The finger 340 is to removably attach to the carrier via a fastener inserted through the first opening of the finger and the second opening of the carrier. In some embodiments, the content contacts the set of fingers without contacting the rigid body during transportation of the carrier. In some embodiments, the openings formed by the rigid body are slots and each finger 340 is adjustably located on the rigid body via the slots. In some examples, the location of the fingers 340 are adjusted based on wear of the fingers 340. In some examples, the location of the fingers 340 are adjusted based on the type (e.g., size, etc.) of the content to be transported by the carrier.

In some embodiments, the sidewall 350 of the finger 340 has an upper portion 352A that has a first angle 354A (e.g., about a 100 to 110 degree angle, about 15 degrees from orthogonal) relative to the first upper surface 342A and the sidewall 350 has a lower portion 352B that has a second angle 354B (e.g., about a 90 to 100 degree angle, about 5 degrees from orthogonal) relative to the first upper surface 342A. In some embodiments, the sidewall 350 further includes a substantially vertical portion 352C that is substantially orthogonal (e.g., about 85 to 95 degree angle) relative to the first upper surface 342A. In some embodiments, the finger 340 further includes a chamfer 356 between the first upper surface 342A and the sidewall 350. In some embodiments, the chamfer 356 of the finger 340 matches (e.g., is substantially the same size as, does not interfere with) a chamfer of content (e.g., process kit ring) disposed on the fingers 340. In some embodiments, a lower surface of content (e.g., process kit ring) disposed on the fingers contacts the first upper surface 342A of the fingers 340. In some embodiments, the angles 354 of the sidewall 350 (e.g., of the upper portion 352A, lower portion 352B, and/or substantially vertical portion 352C) are configured to guide (e.g., align) the content (e.g., process kit ring) onto the fingers 340 for transportation. Conventional carriers transfer content in misaligned orientations and drop content within the substrate processing system. The angles 354 of the sidewall 350 of the fingers 340 prevent content from being one or more of misaligned, crooked, non-parallel, unstable (e.g., dropped from), or the like on the carrier.

In some embodiments, the first upper surface 342A has a first coefficient of friction that is great than a second coefficient of friction of one or more portions of the sidewall 350 (e.g., to assist with securing content to the fingers 340, to assist with aligning the content on the fingers 340, etc.).

FIGS. 4A-F illustrate carriers 400 (e.g., carrier 200 of FIGS. 2A-F) including rigid bodies 410 (e.g., rigid body 210 of FIGS. 2A-F), according to certain embodiments. FIG. 4A is a cross-sectional side view of a carrier 400 including a finger 440 (e.g., finger 240 of FIGS. 2A-F, finger 340 of FIGS. 3A-B) disposed on a boss 422 (e.g., boss 222 of FIGS. 2A-F) of a rigid body 410. FIG. 4B is a perspective view of a carrier 400 including a finger 440 (e.g., finger 240 of FIGS. 2A-F, finger 340 of FIGS. 3A-B) removably attached to a rigid body 410. FIG. 4C is a top view of a rigid body 410 of a carrier 400 that includes a boss 422 (e.g., boss 222 of FIGS. 2A-F) disposed around an opening 420 (e.g., opening 220 of FIGS. 2A-F). FIG. 4D is a cross-sectional side view of a carrier 400 including a finger 440 (e.g., finger 240 of FIGS. 2A-F, finger 340 of FIGS. 3A-B) disposed on a boss 422 (e.g., boss 222 of FIGS. 2A-F) of a rigid body 410. FIG. 4E is a cross-sectional side view of a carrier 400 including a finger 440 (e.g., finger 240 of FIGS. 2A-F, finger 340 of FIGS. 3A-B) disposed on a boss 422 (e.g., boss 222 of FIGS. 2A-F) of a rigid body 410. FIG. 4F is a perspective view of a carrier 400 including a finger 440 (e.g., finger 240 of FIGS. 2A-F, finger 340 of FIGS. 3A-B) removably attached to a rigid body 410.

In some embodiments, features of the rigid body 410 (e.g., boss 422, protruding features 412, or the like) are configured to orient (e.g., align) the finger 440 on the rigid body 410. In some embodiments, a lower surface of the finger 440 forms a recess that is configured to receive the boss 422. In some embodiments, a left side, right side, and/or rear side of the finger 440 is disposed proximate to (e.g., abut) protruding features 412 on the upper surface of the rigid body 410. In some embodiments, the protruding features 412 on the upper surface and/or the boss 422 orient the finger 440 (e.g., to correctly locate the finger on the rigid body 410, to correctly align an opening in the finger 440 with the opening 420 of the rigid body 210 to receive a fastener 430, etc.).

In some embodiments, fingers 440 of carrier 400 support one or more process kit rings 490 (e.g., process kit ring 290 of FIGS. 2E, 2F, and/or 2M). Referring to FIGS. 4D-F, in some embodiments, fingers 440 support a process kit ring 490A and a process kit ring 490B is disposed on the process kit ring 490A. Process kit ring 490A may include a first upper surface, a second upper surface that is lower than the first upper surface, an interior sidewall, an outer sidewall, and a bottom surface. The first upper surface may be substantially parallel with a second upper surface. The outer sidewall may connect the first upper surface and the second upper surface. The inner sidewall may connect the first upper surface and the bottom surface. The interior sidewall may contact at least a portion of a sidewall (e.g., sidewall 350 of FIGS. 3A-B) of the finger 440. A bottom surface of the process kit ring 490A may contact an upper surface (e.g., first upper surface 342A of FIGS. 3A-B) of the finger 440.

A process kit ring 490B may include an upper surface, a bottom surface, an interior sidewall that connects the upper surface and the bottom surface, and an exterior sidewall that connects the upper surface and the bottom surface. In some embodiments, a process kit ring 490B is disposed on the lower surface of the first upper surface and the second upper surface of the process kit ring 490A. In some embodiments, an inner sidewall of the process kit ring 490B may contact the outer sidewall of the process kit ring 490A. In some embodiments, process kit ring 490A is a support ring and process kit ring 490B is an insert ring.

Referring to FIG. 4D, in some embodiments, the finger 440 extends under a portion of a process kit ring 490A. Referring to FIGS. 4E-F, in some embodiments, the finger 440 extends under the process kit rings 490A-B. The finger 440 may form a recess to receive one or more process kit rings 490. The recess of the finger 440 may have a first sidewall (e.g., sidewall 350 of FIGS. 3A-B), an upper surface (e.g., first upper surface 342A of FIGS. 3A-B), and a second sidewall (e.g., opposite the first sidewall). The first sidewall of the finger 440 contacts an interior sidewall of process kit ring 490A and the second sidewall of the finger 440 contacts an exterior sidewall of process kit ring 490B.

In some embodiments, each of the fingers 440 (e.g., three fingers 440) of carrier 400 include form a recess to receive the one or more process kit rings 490 (e.g., see FIGS. 4E-F). In some embodiments, one or more of the fingers 440 of carrier 400 include a recess to receive the one or more process kit rings 490 (e.g., see FIGS. 4E-F) and one or more of the fingers 440 of carrier 400 are partially disposed under at least one of the one or more process kit rings 490 (e.g., see FIG. 4D).

In some embodiments, the carrier 400 may control process kit ring 490 concentricity. The carrier 400 may keep stacked process rings concentric during movements (e.g., of an overhead transport (OHT) and manual FOUP loading and/or vibration). The carrier 400 may keep stacked process kit rings concentric during robot (e.g., factory interface (FI), main frame (MF), transfer chamber, etc.) transport to a process chamber. In some embodiments, the carrier 400 supports one or more process kit rings 490. In some embodiments, the carrier 400 supports two or more process kit rings 490 that are stacked (e.g., ring stack). In some embodiments, the carrier 400 supports two or three process kit rings 490 that are stacked. In some embodiments, the carrier maintains gaps (e.g., gaps between the process kit rings 490 and carrier 400) the same all around while process kit rings 490 are transported by automation (e.g., FI, MF, transfer chamber, etc.). In some embodiments, a lower surface of the carrier 400 is configured to interface with one or more of an FI blade, a MF robot blade, FOUP (e.g., FOUP shelf), loadlock fin, LCF, aligner (e.g., FI aligner), process chamber lift pins, and/or the like.

In some embodiments, fingers 440 of carrier 400 are replaceable. In some embodiments, different sets of fingers 440 are made of different materials (e.g., configured for different temperatures, processes, chemistries, thermal expansion, etc.). In some embodiments, a set of fingers 440 are made of one or more of ceramic, titanium, and/or the like. In some embodiments, the thermal expansion of the set of fingers 440 matches the thermal expansion of the rigid body 410, one or more process kit rings 490, fastener 430, etc. (e.g., at the temperatures that the carrier 400).

Figure 5:
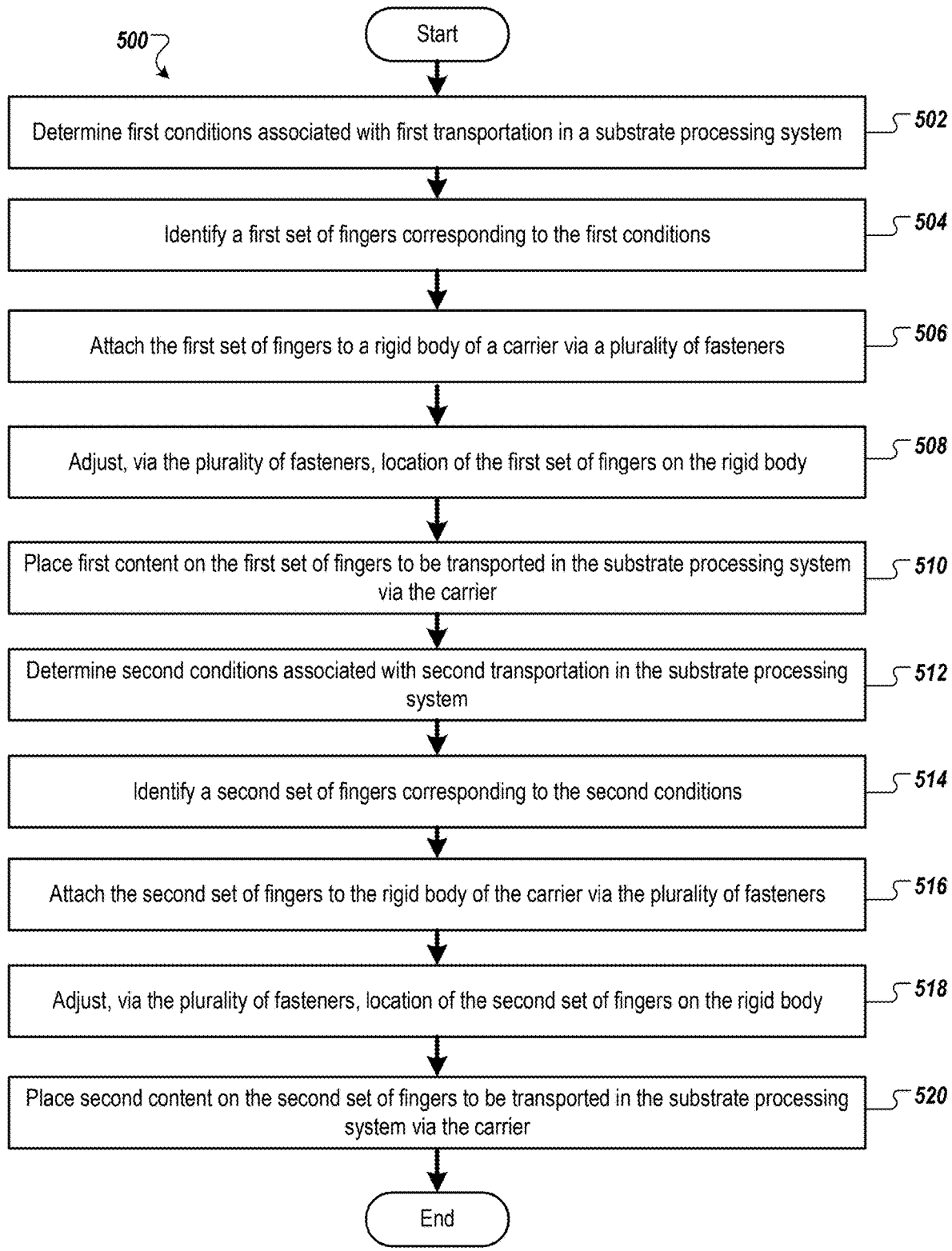
FIG. 5 illustrates a method of using a carrier, according to certain embodiments.

FIG. 5 illustrates a method 500 of using a carrier of a substrate processing system, according to certain embodiments. In some embodiments, one or more of operations of method 500 are performed by a robot arm (e.g., robot arm of factory interface robot 111 of FIG. 1) and/or by a controller (e.g., controller 109 of FIG. 1). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment.

Referring to method 500 of FIG. 5, at block 502, first conditions associated with first transportation in a substrate processing system are determined. In some embodiments, the first conditions comprise one or more of substrate processing operation, chemistry, type of content to be transferred, temperature, pressure, clearance available for the carrier, or the like. In some embodiments, the first conditions are determined based on a recipe (e.g., upcoming operations of the substrate processing system). In some embodiments, the first conditions are determined based on current conditions of one or more portions of the substrate processing system.

At block 504, a first set of fingers corresponding to the first conditions is identified. In some embodiments, the first set of fingers has one or more of a material, roughness, coating, size, height of sidewall, angle(s) of sidewall, shape, quantity, or the like that matches the first conditions.

At block 506, the first set of fingers are attached to a rigid body of a carrier via fasteners. In some embodiments, the first set of fingers are attached to the rigid body autonomously (e.g., via a robot). In some embodiments, the first set of fingers are attached to the rigid body manually. In some embodiments, the first set of fingers are attached to the rigid body outside of the substrate processing system. In some embodiments, the first set of fingers are attached to the rigid body inside of the substrate processing system. In some embodiments, the fingers, fasteners, and rigid body are stored within one or more of the enclosure system (e.g., FOUP), SSP, factory interface, or the like. In some embodiments, the fingers are attached to the rigid body via fasteners using a fastening device (e.g., a fastening robot). In some embodiments, the controller determines the conditions in the substrate processing system, selects one or more of fingers, fasteners, and/or the rigid body based on the conditions, and causes the fastening device to grasp the fingers, fasteners, and/or rigid body, and causes the fastening device to attach the fingers to the rigid body using the fasteners. In some embodiments, the first set of fingers are attached to the rigid body based on the first conditions. In some examples, the orientation, location, inverted placement, quantity, or the like of the set of fingers is based on the first conditions.

At block 508, the location of the first set of fingers is adjusted, via the fasteners, on the rigid body. In some embodiments, the fasteners attach the fingers to slots in the rigid body. In some embodiments, the location of the fingers are measured and adjusted. In some examples, a process kit ring is placed on the fingers and a gap width between a sidewall of a finger and the process kit ring is measured (e.g., via a feeler gauge, via an imaging device, via visual inspection, via determining radial play of the process kit ring on the fingers, or the like). Responsive to determining a gap width is greater than a threshold width (e.g., responsive to the finger being worn), then the location of the finger is adjusted. In some embodiments, to adjust the location of the finger, the finger is moved radially via the slot in relation to a central region of the rigid body. In some embodiments, to adjust the location of the finger, a set screw is adjusted to move the finger radially.

At block 510, the first content is placed on the first set of fingers to be transported in the substrate processing system via the carrier. In some embodiments, the first content comprises one or more of a process kit ring, an edge ring, a showerhead, a mask, a mask handler, a half ring, a stack of two or more process kit rings, or the like.

At block 512, second conditions associated with second transportation in a substrate processing system are determined. In some embodiments, the second conditions are different from the first conditions. In some examples, the second conditions are one or more of substrate processing operation, chemistry, type of content to be transferred, temperature, pressure, or the like that are different than the first conditions.

At block 514, a second set of fingers corresponding to the second conditions is identified. In some embodiments, the second set of fingers is different than the first set of fingers. In some examples, the second set of fingers has one or more of a material, size, shape, quantity, or the like matching that the second conditions and that is different than that of the first set of fingers.

At block 516, the second set of fingers are attached to the rigid body of the carrier via the fasteners. In some embodiments, block 516 is similar to block 506. In some embodiments, the rigid body is the same as that of block 506. In some embodiments, the rigid body is different than that of block 506. In some embodiments, the fasteners are the same as those of block 506. In some embodiments, the rigid body is different than that of block 506.

At block 518, the location of the second set of fingers is adjusted, via the fasteners, on the rigid body. In some embodiments, block 516 is similar to block 508.

At block 520, the second content is placed on the second set of fingers to be transported in the substrate processing system via the carrier. In some embodiments, block 516 is similar to block 510. In some embodiments, the second content is different than that of block 510.

In some embodiments, each of the operations of method 500 are performed while maintaining a sealed environment (e.g., without opening the factory interface, without opening the enclosure system).

Unless specifically stated otherwise, in some embodiments terms such as "determining," "identifying," "attaching," "adjusting," "placing," "transporting," "moving," "lowering," "causing," "removing," "disposing," "locating," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and do not have an ordinal meaning according to their numerical designation.

Examples described herein also relate to an apparatus for performing the methods described herein. In some embodiments, this apparatus is specially constructed for performing the methods described herein, or it includes a general purpose computer system selectively programmed by a computer program stored in the computer system. In some embodiments, such a computer program is stored in a computer-readable tangible storage medium.

The methods and illustrative examples described herein are not inherently related to any particular computer or other apparatus. Various general purpose systems can be used in accordance with the teachings described herein, or a more specialized apparatus can be constructed to perform methods described herein and/or each of their individual functions, routines, subroutines, or operations. Examples of the structure for a variety of these systems are set forth in the description above.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations are performed in an inverse order so that certain operations are performed, at least in part, concurrently with other operations. In another embodiment, instructions or sub-operations of distinct operations are in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A carrier comprising:
    a rigid body forming a plurality of openings extending completely through the rigid body from an upper surface of the rigid body to a lower surface of the rigid body and offset from a perimeter of the rigid body; and
    a plurality of fasteners configured to removably attach to the rigid body via the plurality of openings, wherein:
    a first set of fingers is configured to be removably attached to the rigid body via the plurality of fasteners and the plurality of openings to extend outwardly from the perimeter of the rigid body, the first set of fingers being configured to support a first content substantially parallel to the upper surface of the rigid body during first transportation of the carrier within a substrate processing system; and
    a second set of fingers is configured to be removably attached to the rigid body via the plurality of fasteners and the plurality of openings to extend outwardly from the perimeter of the rigid body responsive to the plurality of fasteners being removed from the first set of fingers and the plurality of openings and the first set of fingers not being attached to the rigid body, the second set of fingers being configured to support a second content substantially parallel to the upper surface of the rigid body during second transportation of the carrier within the substrate processing system.

2. The carrier of claim 1, the first content comprises one or more of:
    a new process kit ring;
    a used process kit ring;
    a new chamber component of the substrate processing system; or
    a used chamber component of the substrate processing system.

3. The carrier of claim 1, wherein each finger of the first set of fingers comprises:
    a first upper surface disposed substantially in a first plane, wherein the first upper surface is configured to receive the first content;
    a second upper surface disposed substantially in a second plane that is above the first plane; and
    a sidewall disposed between the first upper surface and the second upper surface, wherein the sidewall comprises an upper portion that has about a 15 degree angle and a lower portion that has about a 5 degree angle relative to the first upper surface.

4. The carrier of claim 3, wherein each finger of the first set of fingers further comprises a chamfer between the first upper surface and the sidewall.

5. The carrier of claim 3, wherein the sidewall has a first coefficient of friction and the first upper surface has a second coefficient of friction that is greater than the first coefficient of friction.

6. The carrier of claim 1, wherein each finger of the first set of fingers comprises a first type of material configured for first conditions, and wherein each finger of the second set of fingers comprises a second type of material configured for second conditions that are different than the first conditions.

7. The carrier of claim 1, wherein each finger of the first set of fingers has at least one of a first size or a first shape to transport the first content above the rigid body, and wherein each finger of the second set of fingers has at least one of a second size different from the first size or a second shape different from the first shape to transport the second content above the rigid body.

8. The carrier of claim 1, wherein each finger of the first set of fingers is configured to dissipate electrostatic charge.

9. The carrier of claim 1, wherein the first content contacts the first set of fingers without contacting the rigid body during the first transportation of the carrier.

10. The carrier of claim 1, wherein the plurality of openings are slots, wherein each finger of the first set of fingers are adjustably located on the rigid body.

11. The carrier of claim 1, the first set of fingers are three fingers.

12. The carrier of claim 1, wherein one or more of the first set of fingers forms a recess to receive one or more process kit rings supported by the carrier.

13. A finger configured to removably attach to a rigid body of a carrier of a substrate processing system, the finger comprising:
    a first upper surface disposed substantially in a first plane, wherein the first upper surface is configured to support a content substantially parallel to an upper surface of the rigid body the rigid body during transportation of the carrier;
    a second upper surface disposed substantially in a second plane that is above the first plane;
    a sidewall disposed between the first upper surface and the second upper surface; and
    a lower surface, wherein:
    a first opening extends completely through the finger from the second upper surface to the lower surface;
    the lower surface forms a recess to receive a portion of the rigid body forming a second opening;
    the second opening extends completely through the rigid body from an upper rigid body surface of the rigid body to a lower rigid body surface of the rigid body and offset from a perimeter of the rigid body;
    the finger is to removably attach to the rigid body via a fastener inserted through the first opening of the finger and the second opening of the rigid body; and
    the finger is configured to extend outwardly from the perimeter of the rigid body responsive to being removably attached to the rigid body via the fastener.

14. The finger of claim 13, wherein the sidewall comprises an upper portion that has about a 15 degree angle and a lower portion that has about a 5 degree angle relative to the first upper surface.

15. The finger of claim 13, wherein the sidewall has a first coefficient of friction and the first upper surface has a second coefficient of friction that is greater than the first coefficient of friction.

16. The finger of claim 13, wherein the finger is configured to dissipate electrostatic charge.

17. A method comprising:
    determining first conditions associated with first transportation in a substrate processing system;
    identifying a first set of fingers corresponding to the first conditions;
    attaching the first set of fingers to a rigid body of a carrier via a plurality of fasteners and a plurality of openings formed by the rigid body to extend outwardly from a perimeter of the rigid body responsive to the plurality of fasteners being removed from a second set of fingers and the plurality of openings and the second set of fingers not being attached to the rigid body, the plurality of openings being formed by the rigid body and extending completely through the rigid body from an upper surface of the rigid body to a lower surface of the rigid body and offset from the perimeter of the rigid body; and placing a first content on the first set of fingers to be transported substantially parallel to the upper surface of the rigid body in the substrate processing system via the carrier.

18. The method of claim 17 further comprising:

determining second conditions associated with second transportation in the substrate processing system;

identifying the second set of fingers corresponding to the second conditions;

attaching the second set of fingers to the rigid body of the carrier via the plurality of fasteners responsive to the first set of fingers not being attached to the rigid body; and placing a second content on the second set of fingers to be transported in the substrate processing system via the carrier.

19. The method of claim 17 further comprising:
determining second conditions associated with second transportation in the substrate processing system; and
adjusting, via the plurality of fasteners, location of the first set of fingers on the rigid body.

20. The method of claim 17, wherein each finger of the first set of fingers comprises:

a first upper surface disposed substantially in a first plane, wherein the first upper surface is configured to receive the first content;

a second upper surface disposed substantially in a second plane that is above the first plane; and a sidewall disposed between the first upper surface and the second upper surface, wherein the sidewall comprises an upper portion that has about a 15 degree angle and a lower portion that has about a 5 degree angle relative to the first upper surface.

* * * * *